US011742595B2

(12) United States Patent
Morita et al.

(10) Patent No.: US 11,742,595 B2
(45) Date of Patent: Aug. 29, 2023

(54) TESTING DEVICE

(71) Applicant: MORITA TECH CO., LTD., Kawasaki (JP)

(72) Inventors: Osamu Morita, Kawasaki (JP); Akinori Saeki, Kawasaki (JP); Kei Okamoto, Kawasaki (JP); Satoshi Ogura, Kawasaki (JP)

(73) Assignee: MORITA TECH CO., LTD., Kawasaki (JP)

( * ) Notice: Subject to any disclaimer, the term of this patent is extended or adjusted under 35 U.S.C. 154(b) by 283 days.

(21) Appl. No.: 17/309,301

(22) PCT Filed: Oct. 11, 2019

(86) PCT No.: PCT/JP2019/040189
§ 371 (c)(1),
(2) Date: May 17, 2021

(87) PCT Pub. No.: WO2020/110483
PCT Pub. Date: Jun. 4, 2020

(65) Prior Publication Data

US 2022/0013923 A1 Jan. 13, 2022

(30) Foreign Application Priority Data

Nov. 27, 2018 (JP) ................................ 2018-221352

(51) Int. Cl.
*H01Q 21/24* (2006.01)
*H04B 17/10* (2015.01)
(Continued)

(52) U.S. Cl.
CPC .......... *H01Q 21/245* (2013.01); *G01R 29/10* (2013.01); *H04B 17/101* (2015.01)

(58) Field of Classification Search
CPC .... G01R 29/10; G01R 29/08; G01R 29/0821; H01Q 21/24; H01Q 21/245; H01Q 1/12;
(Continued)

(56) References Cited

U.S. PATENT DOCUMENTS 3,806,943 A * 4/1974 Holloway ........... G01R 29/105 343/703
5,134,405 A * 7/1992 Ishihara .............. H05K 9/0001 342/4
(Continued)

FOREIGN PATENT DOCUMENTS

JP H10-62467 A 3/1998
JP 2000-338155 A 12/2000
(Continued)

OTHER PUBLICATIONS

WIPO, Japan International Search Authority, International Search Report (with English translation) and Written Opinion dated Dec. 3, 2019 in International Patent Application No. PCT/JP2019/040189, 10 pages.
(Continued)

*Primary Examiner* — Tho G Phan
(74) *Attorney, Agent, or Firm* — Masuvalley & Partners; Peter R. Martinez

(57) ABSTRACT

The present invention performs characteristic tests on a communication device with a compact and simple configuration. A testing device 1 that performs characteristic tests in a near field on a communication antenna 250 of a communication device 240 includes a tray body 220 that supports the communication device in a test space S as an anechoic chamber, and a coupler support frame 520 that supports coupler antennas transmitting and receiving radio waves to/from the communication antenna 250. The coupler support frame can form inner-periphery coupler antenna arrays 300A and 300B each including a plurality of coupler anten-
(Continued)

nas 300 arranged at least in a row along a curve extending along an inner peripheral surface composed of side surface S1 and S2, an upper surface S3, and a lower surface S4, and a rear coupler antenna array 300C including a plurality of coupler antennas 300 arranged at least in a row in an upper-lower direction along a curve extending along a rear surface S5.

9 Claims, 22 Drawing Sheets

(51) Int. Cl.
*G01R 29/08* (2006.01)
*G01R 29/10* (2006.01)

(58) Field of Classification Search
CPC ........ H01Q 1/1207; H01Q 1/52; H01Q 1/523; H04B 17/10; H04B 17/101; H04B 17/15
See application file for complete search history.

(56) References Cited

U.S. PATENT DOCUMENTS

| | | | |
|---|---|---|---|
| 8,884,830 | B2 | 11/2014 | Chang et al. |
| 9,453,865 | B2 * | 9/2016 | Jimenez ............. G01R 29/0821 |
| 10,044,104 | B1 * | 8/2018 | Bartko ...................... H01Q 3/08 |
| 10,158,433 | B2 * | 12/2018 | Lloyd .................. H04B 17/102 |
| 10,404,384 | B1 * | 9/2019 | Mellein ................. H04W 24/06 |
| 10,483,636 | B1 | 11/2019 | Koto et al. |
| 10,547,103 | B2 * | 1/2020 | Meng ...................... G01R 29/10 |
| 10,768,216 | B2 * | 9/2020 | Abadie .............. G01R 29/0821 |
| 2004/0155824 | A1 | 8/2004 | Nagashima |
| 2005/0276312 | A1 | 12/2005 | Yamaguchi et al. |
| 2010/0039333 | A1 | 2/2010 | Mauksch |
| 2013/0300630 | A1 | 11/2013 | Yang |
| 2018/0287721 | A1 | 10/2018 | Vikstedt et al. |
| 2018/0321292 | A1 | 11/2018 | Bartko et al. |
| 2019/0221938 | A1 | 7/2019 | Kuroiwa et al. |
| 2020/0119460 | A1 | 4/2020 | Maruo et al. |
| 2020/0177289 | A1 | 6/2020 | Maruo et al. |
| 2020/0244377 | A1 | 7/2020 | Maruo |

FOREIGN PATENT DOCUMENTS

| | | | |
|---|---|---|---|
| JP | 2001-133495 | A | 5/2001 |
| JP | 2002-243659 | A | 8/2002 |
| JP | 2003-057281 | A | 2/2003 |
| JP | 2006-234602 | A | 9/2006 |
| JP | 4053981 | B2 | 12/2007 |
| JP | 2009-52990 | A | 3/2009 |
| JP | 2010-25787 | A | 2/2010 |
| JP | 2010-505307 | A | 2/2010 |
| JP | 2010-66274 | A | 3/2010 |
| JP | 2010-133768 | A | 6/2010 |
| JP | 2013-236378 | A | 11/2013 |
| JP | 2019-027997 | A | 2/2019 |
| JP | 2019-096962 | A | 6/2019 |
| JP | 2019-211245 | A | 12/2019 |
| JP | 2020-030164 | A | 2/2020 |
| JP | 2020-060535 | A | 4/2020 |
| JP | 2020-085784 | A | 6/2020 |
| JP | 2020-122678 | A | 8/2020 |
| KR | 2005-0086344 | A | 8/2005 |
| KR | 2009-0088351 | A | 8/2009 |

OTHER PUBLICATIONS

Extended European Search Report dated May 19, 2022 in European Patent Application No. 19891315.4.
Anonymous: "R&S DST200 Rf Diagnostic Chamber User Manual" , Dec. 31, 2016, pp. 1-66, XP055918731, paragraphs [0003]-[03.1], [03.3]-[3.4.2]; figures 3.1-3.7.
KIPO, Korean Office Action issued for KR application No. 10-2021-7018977 dated Jan. 16, 2023, 8 pages.

* cited by examiner

TESTING DEVICE

RELATED APPLICATIONS

This application is the U.S. National Phase of and claims priority to International Patent Application No. PCT/JP2019/040189, International Filing Date Oct. 11, 2019, entitled Testing Device; which claims benefit of and priority to Japanese Application No. 2018-221352 filed Nov. 27, 2018 entitled Testing Device; both of which are incorporated herein by reference in their entireties.

FIELD

The present invention relates to a testing device for a communication device, that performs characteristic tests on communication antennas for a microwave band included in a communication device such as a smartphone, and more particularly relates to a testing device that performs characteristic tests on a fixedly-placed communication device in a near field.

BACKGROUND

A mobile terminal such as a smartphone, a base station, or various types of wireless modules (hereinafter, collectively "communication devices") need to comply with technical standards defined in the Radio Act and characteristic tests to test whether each of the communication devices complies with the technical standards are performed before starting the operation of the communication device. The characteristic tests are performed in an anechoic chamber where entry of radio waves from outside and leakage of radio waves to outside are blocked (or attenuated) and a space that does not reflect radio waves is formed therein.

A horn antenna has conventionally been the mainstream antenna used in the characteristic tests. The horn antenna is disadvantageous in that it cannot perform accurate measurement unless it is, for example, one meter or more away from a communication device being a measurement target because the horn antenna has a significantly large structure relative to wavelengths of a frequency band to be measured. In a case of using the horn antenna, there is a problem that the size of the anechoic chamber is significantly increased due to a large distance from a communication device. Furthermore, quite imperceptible emitted waves need to be measured in a spurious test that is performed to confirm spurious components included in radio waves emitted from a communication device are not beyond an acceptable value. However, if the distance between a communication device and the horn antenna is large, there is a problem that the space loss is increased and the emission level of the spurious components cannot be measured.

Meanwhile, Patent Literature 1 describes an example of a device that measures radio waves emitted from a communication device being a measurement target in a relatively close range from the communication device. An electromagnetic wave measurement device described in Patent Literature 1 includes a plurality of probe antennas that encompass the measurement target in the manner of a perfect circle in a certain vertical plane. In Patent Literature 1, the directivity of radio waves emitted from an antenna of the measurement target can be obtained by detecting the radio waves emitted from the antenna of the measurement target using the probe antennas and measuring the intensity of the radio waves at the location of each of the probe antennas.

CITATION LIST

Patent Literature

Patent Literature 1: Japanese Patent No. 4053981

SUMMARY

Technical Problem

Patent Literature 1 focuses on collecting data to detect the characteristics of the radio waves of the measurement target. However, the communication device being the measurement target is rotated in Patent Literature 1 to three-dimensionally measure the intensity and the orientation of the radio waves emitted from the antenna of the measurement target because the probe antennas do not have the directivity. If a driving device that rotates a communication device is required as in Patent Literature 1, a problem that the configuration of the device is complicated and that the device size is increased occurs.

The present invention has been achieved in view of the situation described above, and an object of the present invention is to enable characteristic tests on a communication device to be performed with a compact and simple configuration.

Solution to Problem

In order to solve the problems described above, the present invention provides a testing device for a communication device, that performs characteristic tests in a near field on at least one test target antenna for a microwave band or a milliwave band included in the communication device, the testing device comprising: a housing that forms a test space as an anechoic chamber in a hollow portion; a communication device support unit that supports the communication device in the test space; and a coupler support unit that detachably supports a plurality of coupler antennas receiving radio waves emitted from the test target antenna or transmitting radio waves to the test target antenna, wherein the coupler support unit includes a plurality of guide rails that linearly extend along one face of the test space and that support the coupler antennas to be movable back and forth along a longitudinal direction of the extending, and a plurality of housing attachment pieces that each have one portion fixed to the housing and that each include an attachment face supporting an associated one of the guide rails at a predetermined elevation angle on another portion, a length from each of the one portions to the corresponding one of the attachment faces, and an inclination angle of each of the attachment faces are set to cause an antenna beam of a corresponding one of the coupler antennas supported by an associated one of the guide rails to be emitted to the communication device at a predetermined elevation angle, and a plurality of the coupler antennas supported by each of the guide rails respectively set to different elevation angles by each of the associated housing attachment pieces form one coupler antenna group, and the antenna beams from the coupler antennas forming the one coupler antenna group are caused to focus on the test target antenna that is handled by the coupler antenna group as a test target.

Advantageous Effects of Invention

According to the present invention, it is possible to perform characteristic tests on a communication device with a compact and simple configuration.

DESCRIPTION OF EMBODIMENTS

Figure 1:
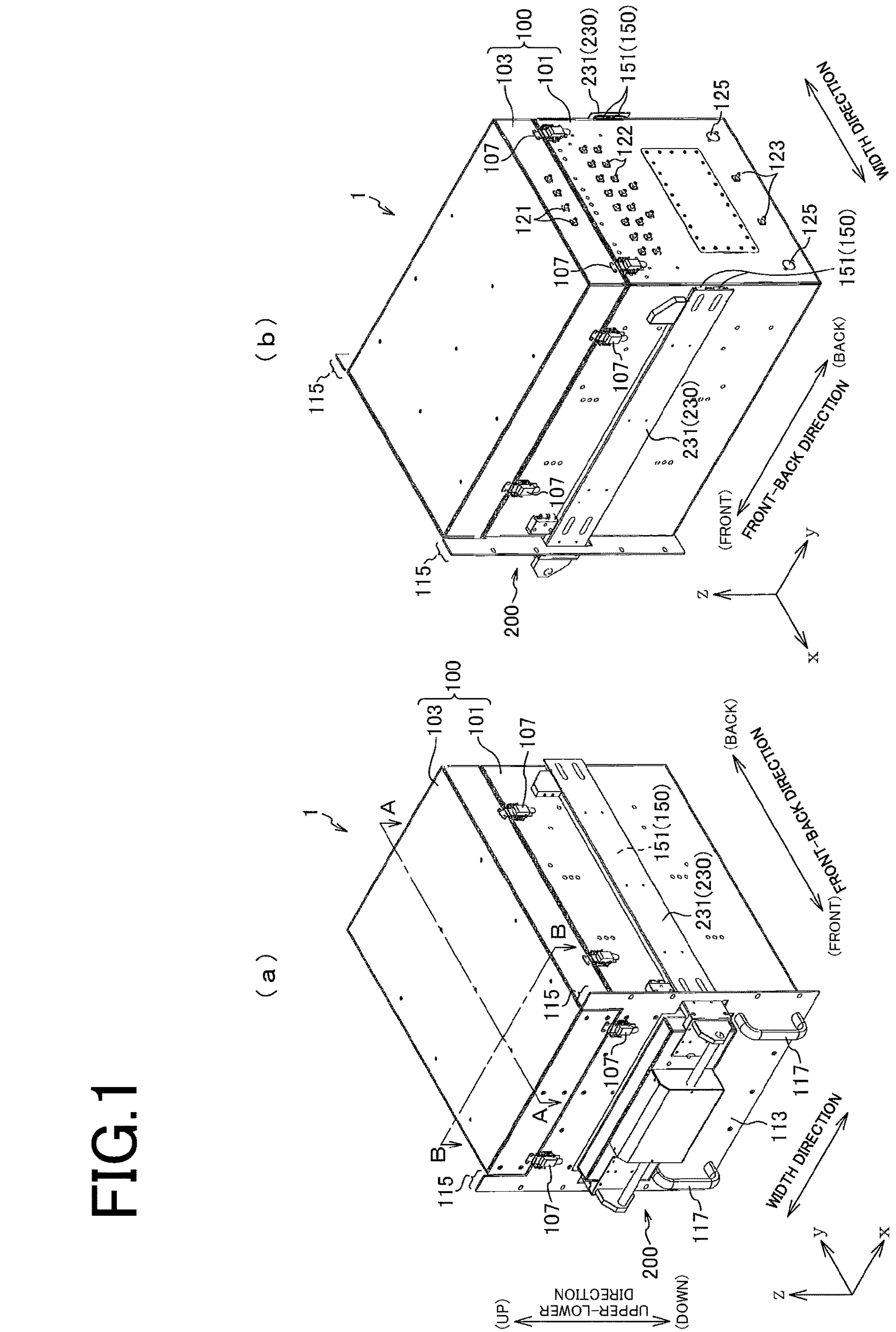
FIG. 1 are perspective views illustrating an external configuration of a testing device according to one embodiment of the present invention, where FIG. 1(*a*) is a view of the testing device observed from the front side and FIG. 1(*b*) is a view of the testing device observed from the back side.

The present invention has a configuration as described below to enable characteristic tests (evaluation tests) on a communication device to be performed with a compact and simple configuration.

That is, a testing device 1 according to the present invention is a testing device for a communication device, that performs characteristic tests on a communication antenna 250 (a test target antenna) for a microwave band or a milliwave band included in a communication device 240 in a near field. The testing device 1 is characterized in including an anechoic box (a housing 100, a panel portion 210 of a tray unit 200, and radio wave absorbers 131 and 211) that forms a test space S serving as an anechoic chamber, a communication device support unit (a tray body 220) that supports the communication device 240 in the test space S, a plurality of inner-periphery coupler antennas (coupler antennas 300 constituting coupler antenna arrays 300A and 300B) that are arranged at least in a row along a curve extending along an inner peripheral surface composed of opposing two side surfaces S1 and S2, an upper surface S3, and a lower surface S4 of the anechoic box (the test space S) to receive radio waves emitted from the test target antenna or transmit radio waves to the test target antenna, and rear coupler antennas (coupler antennas 300 constituting a coupler antenna array 300C) that are arranged at least in a row in an upper-lower direction along a curve extending along a rear surface S5 intersecting with the circumferential direction of the inner peripheral surface to receive radio waves emitted from the test target antenna or transmit radio waves to the test target antenna.

The present invention is described below in detail based on embodiments illustrated in the drawings. The constituent elements, types, combinations, shapes, and relative arrangement thereof described in the embodiments are merely explanatory examples and are not intended to limit the scope of the present invention thereto, unless otherwise specified.

[Characteristic Tests that can be Performed in the Present Testing Device]

Tests such as a power measurement of communication antennas mounted on a communication device, an EVM (error vector magnitude) measurement, a spurious measurement, a MIMO (Multiple-Input and Multiple-Output) test, and a beam forming test can be performed using the present testing device. A handover test can be performed in some conditions. A protocol test can also be performed. These tests are explained below.

The power measurement test is a test to measure power intensity at a time when radio waves are emitted from a communication device to a certain coupler antenna.

The EVM measurement is a test to measure accuracy at which a digital signal is modulated and is transmitted through radio waves.

The spurious test is a test to measure whether communication antennas are not emitting radio waves of frequencies other than an objective frequency.

The MIMO is a method of dividing digital data and transmitting divided data in parallel, and is a communication system used in a case in which a communication device includes a plurality of communication antennas, in which digital data is transmitted or received in parallel and at the same time by the communication antennas to increase the communication capacity. In the MIMO test, data is transmitted from a communication device through a plurality of communication antennas at the same time and at the same frequency and the data is received at the same time by a plurality of antennas on a reception side and the received data is computed, whereby original data is restored from parallel data simultaneously received to test whether the transmission/reception amount of data per unit time is increased.

The beam forming test is a test to check whether radio waves are emitted only in a direction from a communication device to a base station that communicates with the communication device.

The handover is switching a base station that communicates with a communication device during movement of the communication device from one base station to another base station. In the handover test, a communication device or coupler antennas that function as base stations need to be moved in the testing device. Therefore, in a case of performing this test, a moving unit (a driving unit) that moves the communication device or the coupler antennas needs to be placed inside the testing device. Alternatively, this test can be performed by adjusting the intensities of radio waves applied to the coupler antennas corresponding to the base stations, respectively, to reproduce the coupler antennas as electrically moving, without actually moving the coupler antennas.

The protocol test is a test to verify whether communication between a base station and a communication device is reliably established or whether the communication device is correctly controlled, by exchange of a predetermined command (for example, an instruction word or a status) between the base station and the communication device in accordance with a predetermined procedure (protocol). In the protocol test, whether various instructions or situations such as power control of radio waves, beam forming control, line control, handover control, call data communication control, base station information, or terminal location information can be exchanged in accordance with a determined procedure is checked.

In this manner, according to the present testing device, communication tests required in a fifth-generation mobile communication system can be performed by one testing device.

Each of communication antennas mounted on a communication apparatus is constituted by a combination of an antenna for horizontally polarized waves and an antenna for vertically polarized waves as one unit or is constituted by either an antenna for horizontally polarized waves or an antenna for vertically polarized waves.

The power measurement test and the spurious measurement among the tests described above require at least one coupler antenna for one communication antenna, and the beam forming test requires at least three coupler antennas for one communication antenna. In the following explanations, at least three coupler antennas each associated with one communication antenna on a one-to-one basis as coupler antennas that perform the characteristic tests described above is referred to as “coupler antenna group”.

The MIMO test requires at least two coupler antennas for one communication antenna. The EVM measurement and the protocol test require at least one coupler antenna for one communication antenna. The handover test requires at least two coupler antennas for one or a plurality of communication antennas.

Particularly in the power measurement test and the EVM measurement test among the tests described above, a case in which a communication antenna and the corresponding coupler antennas are arranged to have equal distances therebetween is preferable than a case in which the distances between a communication antenna and the corresponding coupler antennas vary because the loss incurred when emitted radio waves propagate in a space can be uniformed and a more accurate test result is obtained.

First Embodiment

Figure 2:
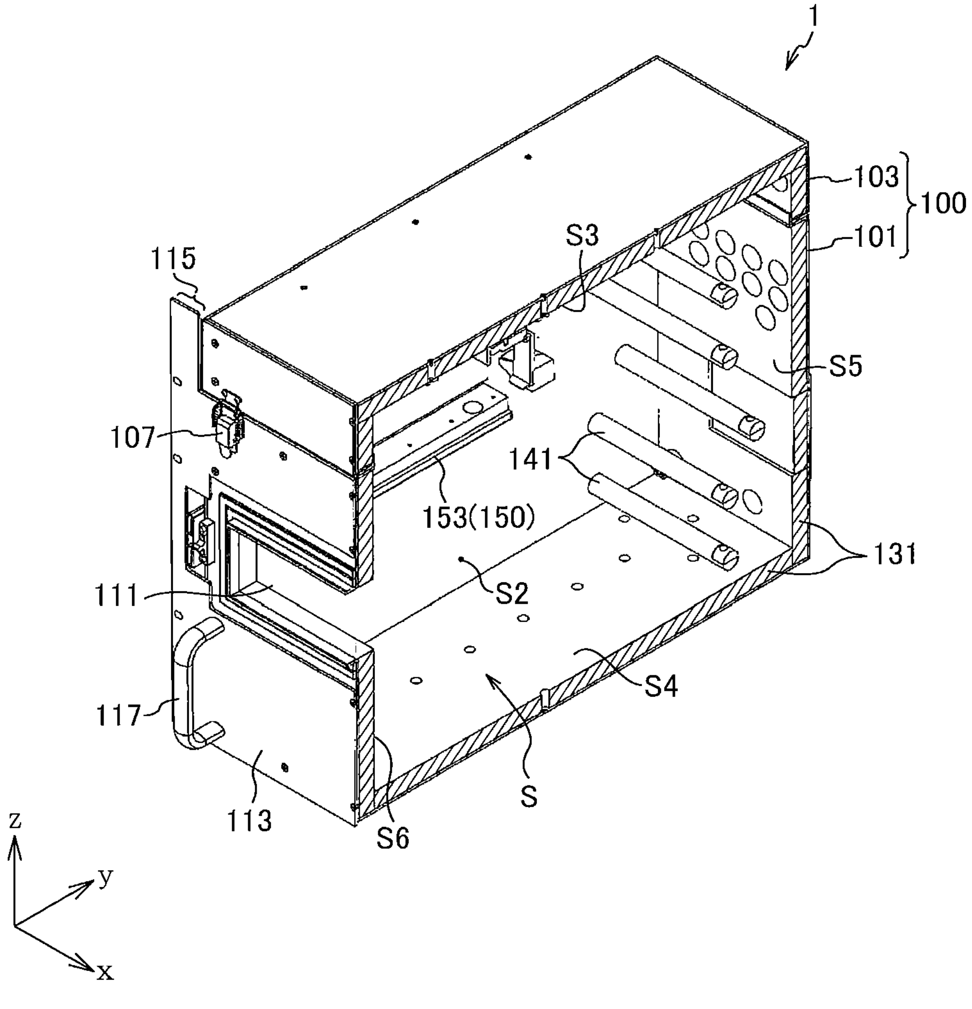
FIG. 2 is a longitudinal sectional perspective view illustrating an internal structure of a housing.
Figure 3:
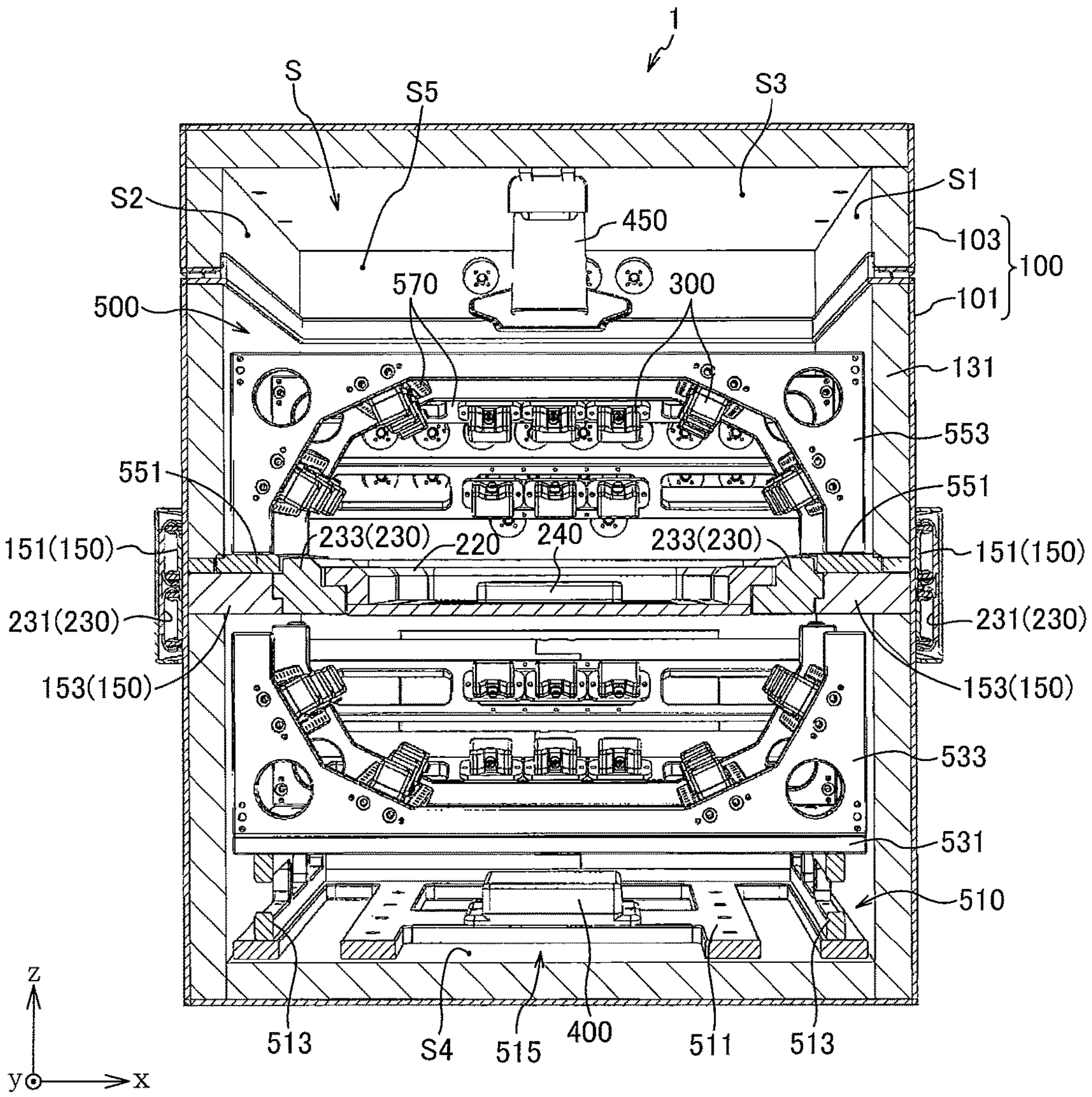
FIG. 3 is a transverse sectional projection illustrating an internal structure of the testing device.

FIG. 1 are perspective views illustrating an external configuration of a testing device according to one embodiment of the present invention, where FIG. 1(*a*) is a view of the testing device observed from the front side and FIG. 1(*b*) is a view of the testing device observed from the back side. FIG. 2 is a longitudinal sectional perspective view illustrating an internal structure of the housing. FIG. 2 is a perspective view illustrating the housing taken on an A-A plane illustrated in FIG. 1(*a*). FIG. 3 is a transverse sectional projection illustrating an internal structure of the testing device. FIG. 3 is a projection of the housing taken on a B-B plane illustrated in FIG. 1(*a*).

The testing device illustrated in the present embodiment is a testing device suitable for performing characteristic tests on a communication device used in a fixed manner, such as a base station or a gas meter, and characteristic tests on a mobile communication terminal such as a smartphone.

The illustrated testing device 1 has a shape of a substantially cuboid and has a size mountable in a so-called 19-inch rack. In the following explanations, a width direction (an X direction), a front-back direction (a Y direction), and an upper-lower direction (a Z direction) are defied as illustrated in FIG. 1 with respect to an attitude of the testing device 1 mounted in a 19-inch rack <Housing>

<External Configuration>

The testing device 1 includes the housing 100 that houses therein various devices such as coupler antennas required for testing communication antennas, and that forms a test space S serving as an anechoic chamber in a hollow portion. The housing 100 is formed of a metallic material such as aluminum, that can form an electromagnetically sealed space. The housing 100 includes a housing body 101 in a shape of a substantially cuboid that is open on an upper surface (one face), and an upper cover 103 that openably closes the upper surface opening of the housing body 101. The upper cover 103 is detachably fixed to the housing body 101 with clasps 107.

The housing body 101 includes a tray opening 111 that is formed through a part of the front surface. The tray body 220 (see FIG. 4) of the tray unit 200 that supports a communication device being a test object is housed in the test space S formed in the hollow portion of the housing body 101 to be capable of being freely ejected from the tray opening 111.

Flange portions 115 and 115 protruding outward are formed on both end portions in the width direction of a front panel 113 of the housing 100, and the flange portions 115 and 115 are detachably fixed to a frame of the 19-inch rack. Grips 117 and 117 are provided on the front surface of the housing body 101 in a protruding manner to fit the testing device 1 to the 19-inch rack or eject the testing device 1 out of the 19-inch rack.

A plurality of coaxial connectors 121, 122, and 123 and a plurality of USB (Universal Serial Bus) connectors 125 are attached to the back surface of the housing 100.

The coaxial connectors 121 to 123 are means for transmitting/receiving an AC signal output to the coupler antennas 300, an NFC (Near Field Communication) antenna unit 400 (see FIG. 3) installed in the hollow portion of the housing 100, and the like, or an AC signal received by these antennas to/from an external device. The antennas are electrically connected to the coaxial connectors 121 to 123 via coaxial cables wired in the test space S.

The USB connectors 125 are means for transmitting/receiving information to/from the NFC antenna unit 400 or a camera unit 450 installed in the hollow portion of the housing 100. The NFC antenna unit 400 and the camera unit 450 are electrically connected to the USB connectors 125 and 125 via USB communication cables wired in the test space S. The camera unit 450 is placed just above the communication device 240 being the test object and is a means for taking an image of a view on a display 241 (see FIG. 4) of the communication device 240 as a moving image to monitor whether the communication device 240 is normally operating during a test.

<Internal Configuration>

As illustrated in FIG. 2, radio wave absorbers that absorb radio waves of a predetermined frequency are attached to six internal surfaces facing the test space S in the testing device 1. The radio wave absorbers 131 are attached to inner surfaces of the housing 100, and the radio wave absorber 211 is attached to an internal surface (see FIG. 4) of the tray unit 200 facing the test space S. The tray opening 111 is attenuated or blocked by the radio wave absorber 211 in regard to radio waves. The test space S serving as an anechoic chamber (an echo-free chamber) is formed inside the housing 100. A front panel 210*a* of the tray unit 200 described later and the radio wave absorber 211 in addition to the housing 100 and the radio wave absorbers 131 function as the anechoic box forming the test space S.

A plurality of cable guides 141, 141, . . . that guide lines arranged in the test space S are provided in a hanged manner in a rear end portion of the test space S. The cable guides 141 illustrated in this example are hung so as to extend in the width direction in the test space S by being supported on both end portions in the longitudinal direction by both end portions in the width direction of the housing 100. While the cable guides 141 are arranged side by side in the upper-lower direction in the test space S, the cable guides 141 are arranged in such a manner that the locations in the front-back direction are staggered (in a zig-zag manner).

The cable guides 141 have a configuration that prevents reflection of electromagnetic waves as much as possible. For example, the cable guides 141 are formed of a resin material (for example, polyethylene) having a relatively low permittivity that enables electromagnetic waves of a frequency being a measurement target to pass. A resin material (for example, polyethylene) having a low permittivity is also selected as a material that constitutes other members (guide rails, sliders, the tray body, the frame, and the like) arranged in the test space S from the same standpoint as that of the cable guides 141.

<Guide Rails>

The housing body 101 includes guide rails 150 (151 and 153) that guide the tray unit 200 to be movable back and forth (to be slidable) in the front-back direction, at appropriate locations on the both end portions in the width direction. The guide rails 150 in the present example are each configured to include an outer guide rail 151 placed on an outer side surface of the housing body 101 as illustrated in FIG. 1(*b*) and the like, and an inner guide rail 153 placed in the test space S of the housing body 101 as illustrated in FIG. 2 and the like. The inner guide rails 153 are respectively fixed to the internal surfaces located on both end portions in the width direction of the housing body 101.

<Tray Unit>

Figure 4:
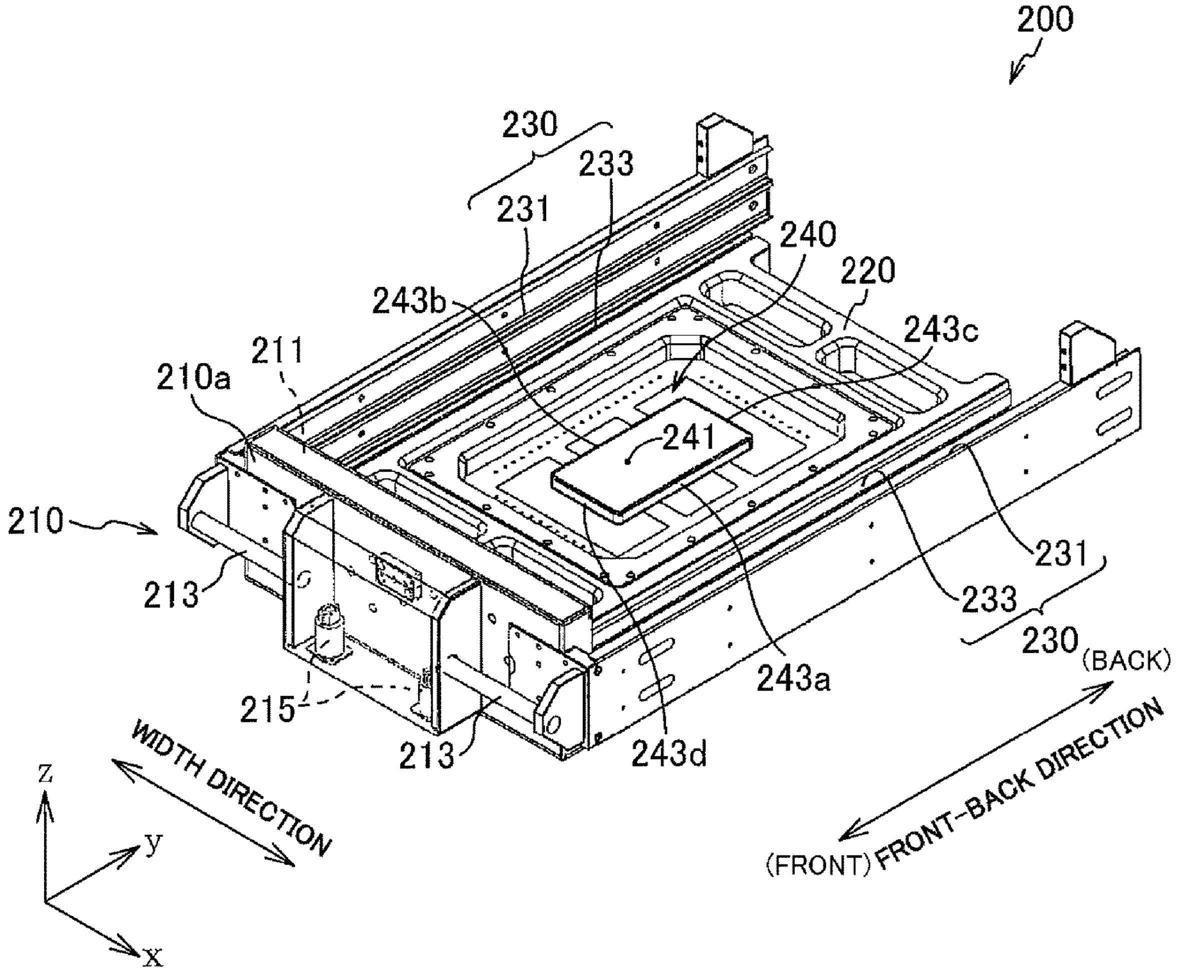
FIG. 4 is a perspective view of a tray unit according to a first embodiment of the present invention, which is observed from the front side.

FIG. 4 is a perspective view of the tray unit according to the first embodiment of the present invention, which is observed from the front side.

The tray unit 200 (the communication device support unit) supports the communication device 240 in a predetermined attitude in the test space S.

The tray unit 200 includes the panel portion 210 that openably closes the tray opening 111, the tray body 220 that is protruded backward from the rear surface (the back surface) of the panel portion 210 and that supports the communication device 240 (test object) including communication antennas (test target antennas) at a predetermined location and in a predetermined attitude, and sliders 230 (outer sliders 231 and inner sliders 233) that extend backward from both end portions in the width direction of the panel portion 210 and that engage with the guide rails 150 (the outer guide rails 151 and the inner guide rails 153) formed on the housing body 101 to move the tray unit 200 back and forth in the front-back direction.

<Panel Portion>

The panel portion 210 is placed in the front part of the tray unit 200.

The front panel 210*a* of the panel portion 210 is formed of a metallic material such as aluminum, that can form an electromagnetically sealed space, and forms an electromagnetically sealed space along with the housing 100. In the panel portion 210, the radio wave absorber 211 is attached to a site facing the test space S and forms the echo-free room along with the radio wave absorbers 131 arranged inside the housing 100.

Tray handles 213 and 213 for housing the tray body 220 in the test space S or ejecting the tray body 220 out of the test space S are attached to the front surface of the panel portion 210.

USB connectors 215 and 215 are arranged at appropriate places of the panel portion 210. The USB connectors 215 are electrically connected to the communication device 240 via USB communication cables, thereby feeding power from an external device to the communication device 240 or transmitting/receiving information (an instruction for emission of radio waves or the like) required for a test between an external device and the communication device 240. In the present example, the USB connectors 215 are arranged, for example, with plugs thereof facing downward.

<Tray Body>

The tray body 220 is inserted into the test space S or ejected out of the test space S through the tray opening 111. The tray body 220 illustrated in the drawing has a substantially rectangular shape in a planar view (a top view).

The tray body 220 includes a positioning member (not illustrated) that positions the communication device 240 at a predetermined location and in a predetermined attitude and the communication device 240 is mounted on the tray body 220 in a state positioned at a predetermined location by the positioning member. With positioning of the communication device 240 on the tray body 220, the locations of the communication antennas in the test space S are fixedly determined.

<Communication Device>

In a fifth-generation communication system, some frequencies are selected from a frequency range from 600 MHz to 70 GHz and are used.

The communication device 240 includes antennas for an ultra-high frequency band, a microwave band, or a milli-wave band at any places. The communication antennas 250 (see FIG. 5) support frequencies equal to or higher than 24 GHz. The communication device 240 includes an antenna that supports Wi-Fi (2.4 GHz and 5.2 GHz) and Bluetooth (registered trademark) (a 2.4-GHz band), and an antenna that supports 600 MHz to 4.5 GHz being sub-frequencies for the fifth generation communication (5G) at any places. The communication device 240 also includes an NFC antenna that supports the NFC (13.56 MHz).

For example, in a case in which the communication device 240 is a smartphone in a substantially rectangular shape having a predetermined thickness in a planar view, the communication antennas 250 are placed at any places in the plane or at least any one of end edges 243 (243*a* to 243*d*).

The location, the attitude, and the orientation of the communication device 240 with respect to the tray body 220 are determined on the basis of the location relation between the communication antennas 250 and the coupler antennas 300 that transmit/receive radio waves for a test to/from the communication antennas 250.

In the following explanations, it is assumed that an end edge including a connection terminal to which a wired cable such as a USB communication cable is connected is the lower end edge 243*d*, and the communication antennas 250 are arranged at the end edges 243*a* and 243*b* in the width direction and the upper end edge 243*c* except for the lower end edge 243*d*.

For example, the communication device 240 is mounted on the tray body 220 in such a manner that the display 241 faces upward, the end edges 243*a* and 243*b* in the width direction are located along the front-back direction of the testing device 1, and the upper end edge 243*c* and the lower end edge 243*d* are located along the width direction of the testing device 1. The communication device 240 is mounted on the tray body 220 to position the lower end edge 243*d* on the front side of the testing device 1.

The location relation between the communication antennas 250 mounted on the communication device 240 and the coupler antennas 300 will be described later.

<Sliders>

The sliders 230 each include the outer slider 231 that engages with the outer guide rail 151, and the inner slider 233 that engages with the inner guide rail 153. The inner sliders 233 are arranged on both end portions in the width direction of the tray body 220, and the inner sliders 233 move in the front-back direction along with the tray body 220 while being guided by the corresponding inner guide rails 153 inside and outside the test space S through the tray opening 111, respectively.

The outer sliders 231 extend in parallel to the inner sliders 233 with a predetermined distance in the width direction away from the corresponding inner sliders 233, and move in the front-back direction outside the testing device 1 while being guided by the corresponding outer guide rails 151, respectively.

<Antennas and Communication Device>

Figure 5:
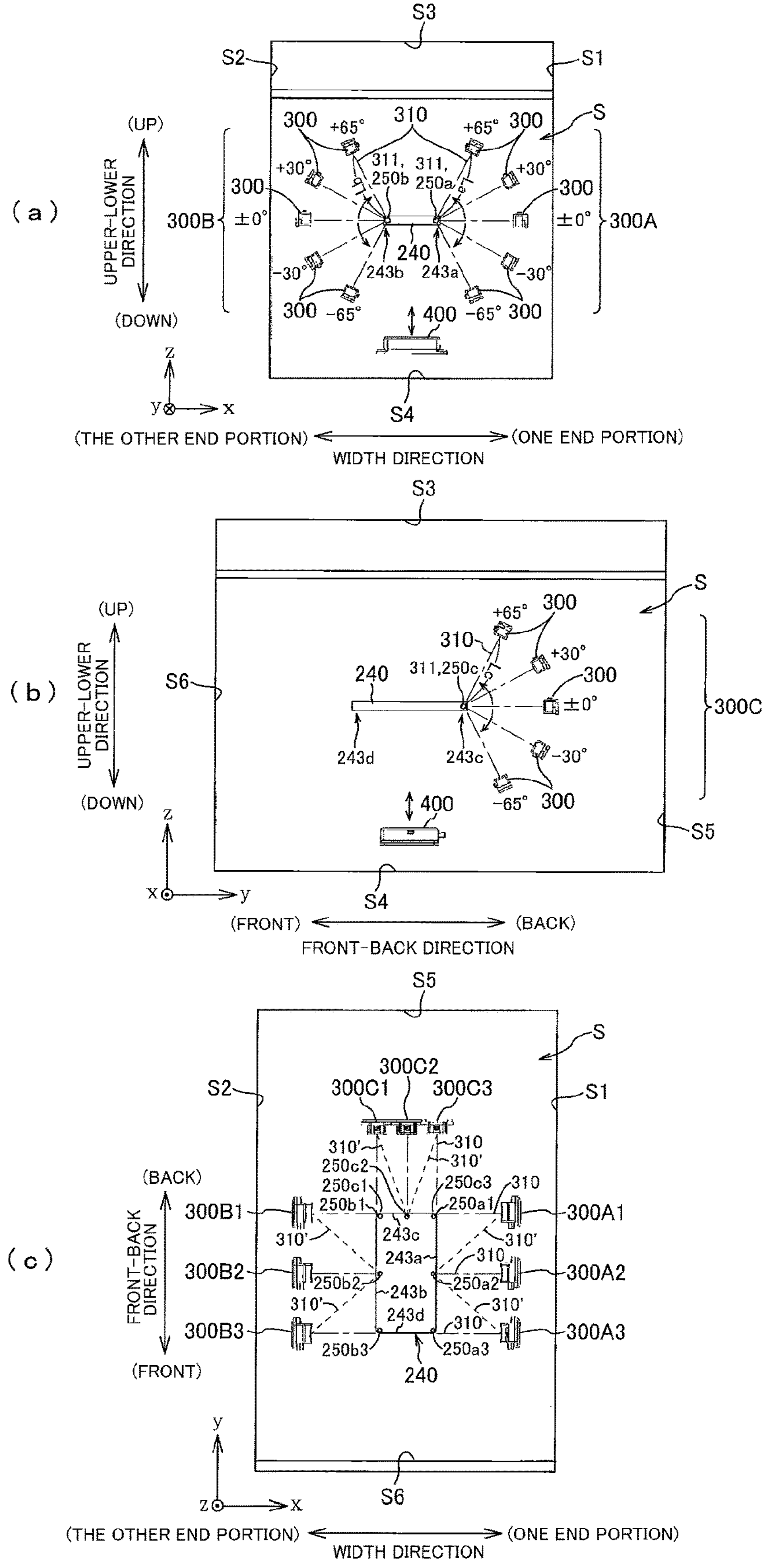
FIG. 5 are diagrams illustrating a location relation between a communication device and coupler antennas where FIG. 5(*a*) is a diagram illustrating arrangement in a Z-X plane, FIG. 5(*b*) is a diagram illustrating arrangement in a Y-Z plane, and FIG. 5(*c*) is a diagram illustrating arrangement in an X-Y plane.

FIG. 5 are diagrams illustrating a location relation between the communication device and the coupler antennas where FIG. 5(*a*) is a diagram illustrating arrangement in a Z-X plane, FIG. 5(*b*) is a diagram illustrating arrangement in a Y-Z plane, and FIG. 5(*c*) is a diagram illustrating arrangement in an X-Y plane.

The coupler antennas 300 arranged so as to encompass the communication device 240, and optionally the NFC antenna unit 400 including an NFC communication substrate are arranged in the test space S. The NFC antenna unit 400 is placed, for example, just below the communication device 240. Details of the arrangement locations of the coupler antennas 300 are described later.

<Coupler Antennas>

The coupler antennas 300 (first coupler antennas) arranged in the test space S perform, with respect to the communication antennas 250 (see FIG. 5), a transmission/reception test of radio waves to/from the communication antennas 250 mounted on the communication device 240 in a near field range of measurement target frequencies (a frequency band of 24 GHz to 43.5 GHz) or in a close range where the communication antennas 250 and the coupler antennas 300 are close to each other (a limit distance where level differences among the coupler antennas are detectable when beams are emitted to the coupler antennas). That is, the coupler antennas 300 are means for receiving radio waves for a test emitted from the communication antennas 250 or transmitting radio waves for a test to the test target antennas.

The near field (or a Fresnel region) indicates a region near an antenna, in which the wave impedance is considerably different from the free-space impedance (375 ohms). The antenna characteristics in this region are not stable and are not generally used for measurements. In a case in which the wavelength relative to the frequency is λ and the antenna opening maximum dimension is D, a region within a distance 2D^2/λ is called “near field”. For example, when the frequency is 20 GHz and the antenna opening maximum dimension is 3 centimeters, the wavelength is 0.015 meter and 2D^2/λ is 12 centimeters. Therefore, a region within this distance is called “near field” and a region far from this distance is called “far field”.

The close range indicates a limit distance where the level differences among coupler antennas are detectable when beams are emitted to the coupler antennas. This distance is related to directivity characteristics of the coupler antennas and a distance of 100 millimeters is adopted because actual measurement shows that this distance is a nearest distance where the level differences among the coupler antennas are clear.

Figure 6:
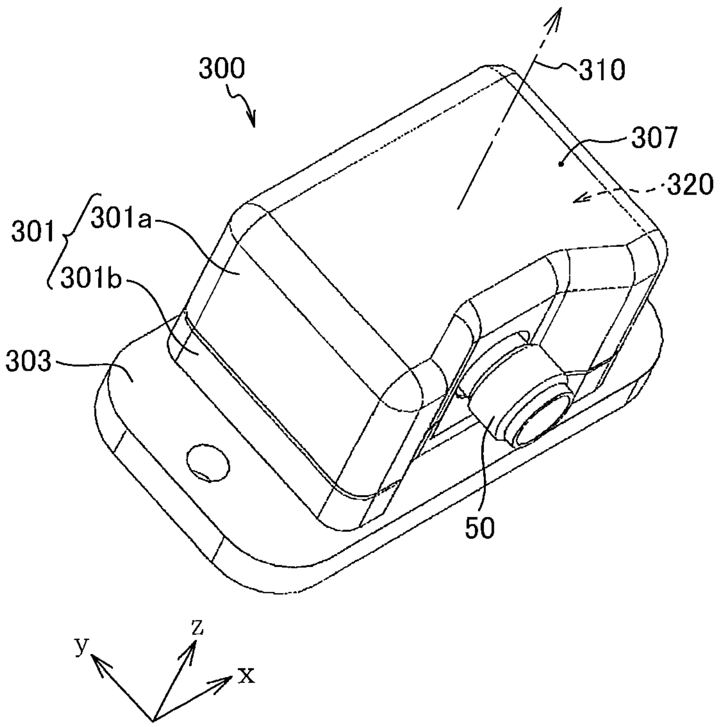
FIG. 6 is a perspective view illustrating an external configuration of the coupler antenna.

FIG. 6 is a perspective view illustrating an example of an external configuration of the coupler antenna.

Each of the coupler antennas 300 includes a case 301 including a front cover 301*a* and a rear cover 301*b*, an attachment base 303 that is integrated with the rear cover 301*b* to enables attachment of the coupler antenna 300 to a desired position, and an antenna body 320 housed inside the case 301. The case 301 is, for example, formed of ABS resin. A face of each of the coupler antennas 300 on the opposite side to the attachment base 303 is a transmitting/receiving face 307 that transmits/receives radio waves to/from the communication device 240. The sign 310 denotes an antenna beam emitted from the coupler antenna 300 and indicates a central axis of the antenna body 320.

<Structure of Antenna Body>

Figure 7:
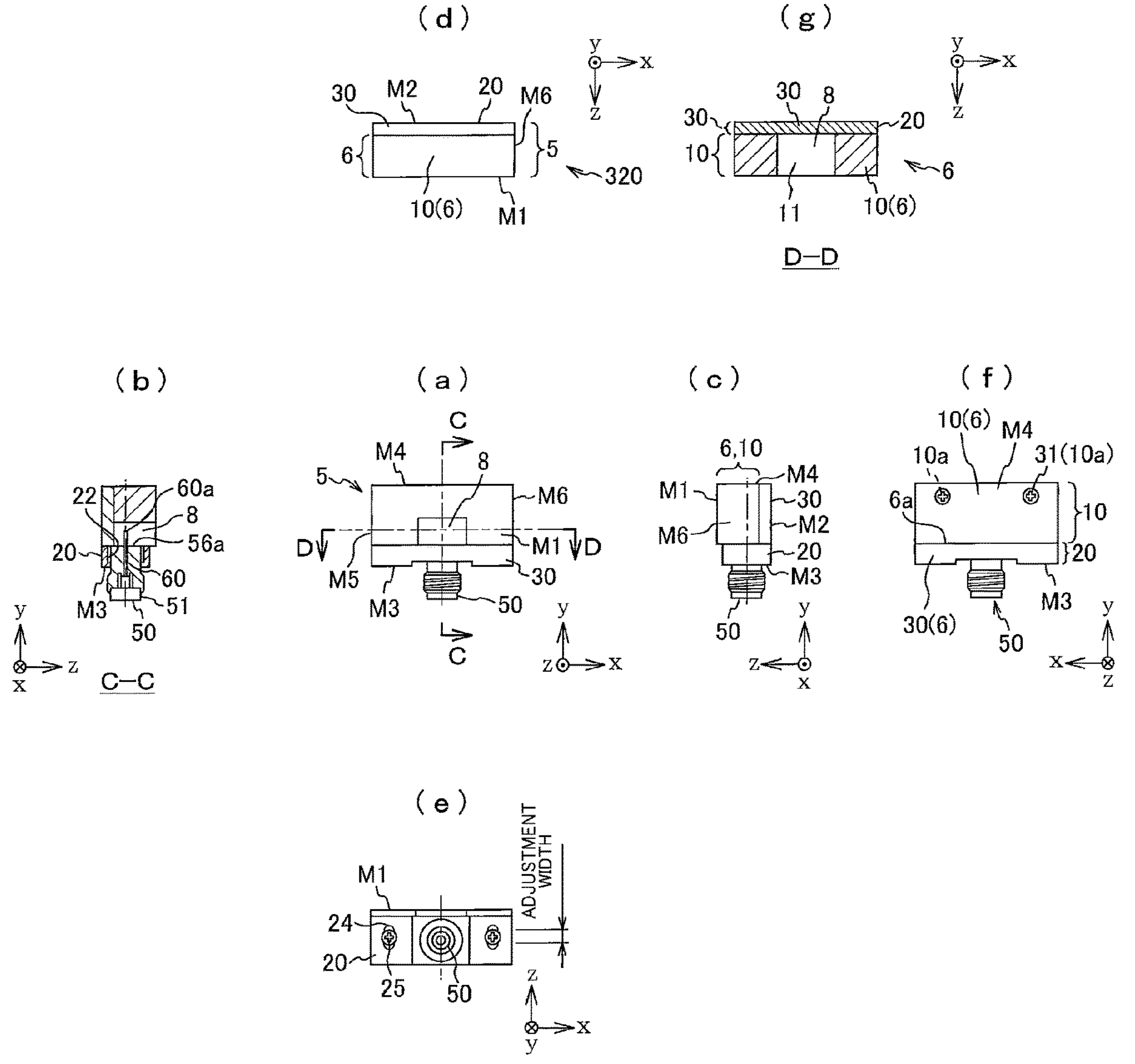
FIG. 7(*a*) is a front view illustrating a structure of an antenna body according to the embodiment of the present invention, FIG. 7(*b*) is a sectional view along a line C-C in FIG. 7(*a*), FIG. 7(*c*) is a right side view, FIG. 7(*d*) is a top view, FIG. 7(*e*) is a bottom view, FIG. 7(*f*) is a rear view, and FIG. 7(*g*) is a sectional view along a line D-D in FIG. 7(*a*).

FIG. 7(*a*) is a front view illustrating a structure of the antenna body according to one embodiment of the present invention, FIG. 7(*b*) is a sectional view along a line C-C in FIG. 7(*a*), FIG. 7(*c*) is a right side view, FIG. 7(*d*) is a top view, FIG. 7(*e*) is a bottom view, FIG. 7(*f*) is a rear view, and FIG. 7(*g*) is a sectional view along a line D-D in FIG. 7(*a*).

Figure 8:
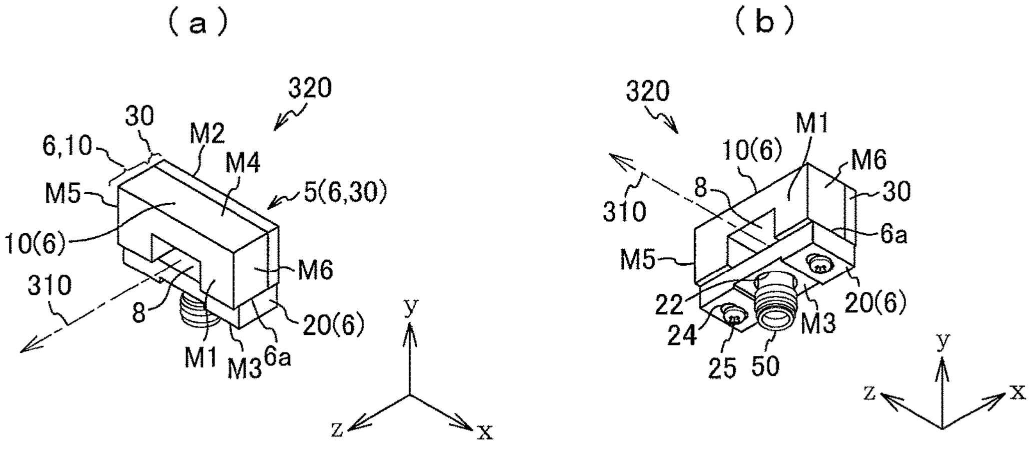
FIGS. 8(*a*) and 8(*b*) are perspective views illustrating the structure of the antenna body according to the embodiment of the present invention.
Figure 9:
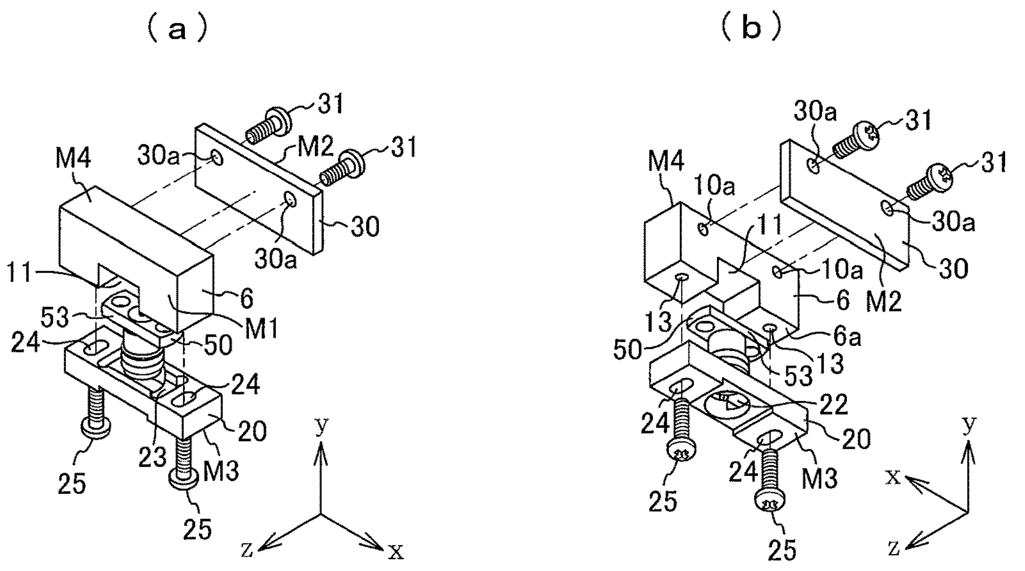
FIGS. 9(*a*) and 9(*b*) are exploded perspective views illustrating the structure of the antenna body according to the embodiment of the present invention.
Figure 10:
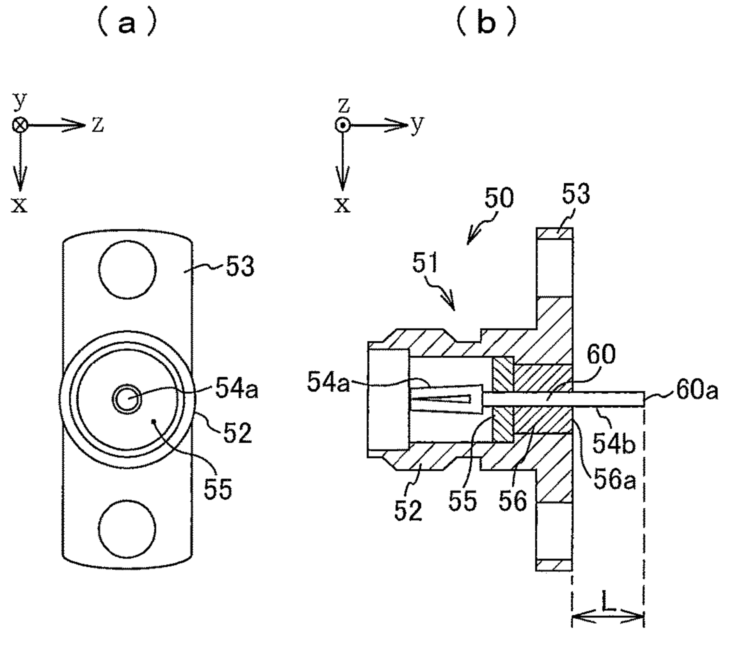
FIGS. 10(*a*), 10(*b*), and 10(*c*) are a bottom view, a sectional view, and a top view of a connector according to the embodiment of the present invention.

FIGS. 8(*a*) and 8(*b*) are perspective views illustrating the structure of the antenna body according to the embodiment of the present invention. FIGS. 9(*a*) and 9(*b*) are exploded perspective views illustrating the structure of the antenna body according to the embodiment of the present invention. FIGS. 10(*a*), 10(*b*), and 10(*c*) are a bottom view, a sectional view, and a top view of a connector according to the embodiment of the present invention.

In FIGS. 6 to 10, explanations are provided on the basis of a coordinate system of the front view illustrated in FIG. 7(*a*), where a direction from the left to the right on the plane of paper is an x-axis direction, a direction orthogonal to the x-axis direction in the plane of paper is a y-axis direction, and a direction (a vertical direction) orthogonal to the x-axis direction and the y-axis direction is a z-axis direction.

The antenna body 320 generally includes a waveguide body 5 formed through a central part of two opposing first and second faces M1 and M2 and including an internal space 8 closed on an opening on the second face side, and a connector 50 that is placed in a connector fitting hole 22 formed through a part between an outer periphery (a third face M3) different from a face on which the internal space 8 is formed to the internal space 8 and that has a radiator provided on one end portion and exposed in the internal space 8.

The waveguide body 5 is generally constituted of a coaxial waveguide converter 6 in a rectangular block shape having a predetermined uniform thickness, and a closing member 30 in a thin plate shape that closes one of openings of the internal space 8 formed through the coaxial waveguide converter 6.

The coaxial waveguide converter 6 and the closing member 30 are both formed of a conducting material such as copper, iron, aluminum, brass, metamaterial, or plastic plated with metal.

The coaxial waveguide converter 6 is a hexahedron made of a conductive material and includes the first face M1 and the second face M2 opposing each other, the third face M3 and a fourth face M4 opposing each other, and a fifth face M5 and a sixth face M6 opposing each other.

The coaxial waveguide converter 6 includes a first waveguide member 10 including a depressed portion 11 serving as the internal space 8 on a face 6*a*, and a second waveguide member 20 removably attached to one face of the first waveguide member 10 to close the one face side of the depressed portion 11 and form the internal space 8.

In FIGS. 9(*a*) and 9(*b*), round screw holes 13 are formed on the face 6*a* of the first waveguide member 10 at places sandwiching the depressed portion 11, respectively, and elongate holes 24 extending in parallel to the z-axis direction of the internal space 8 are formed on the second waveguide member 20 at positions matching (corresponding to) the screw holes 13, to enable screws 25 to be screwed into the screw holes through the corresponding elongate holes 24, respectively. The second waveguide member 20 is displaceable with respect to the first waveguide member 10 in a range of the length of the elongate holes 24 in the longitudinal direction (the z-axis direction) in a state where the screws 25 are screwed into the corresponding screw holes 13. In the present example, a central part in the longitudinal direction of the outer side surface (the third face M3) of the rectangular second waveguide member 20 is a concave portion and the connector fitting hole 22 is formed in the concave portion. The elongate holes 24 are formed on convex portions located on both sides of the concave portion.

The second waveguide member 20 opposing the face 6*a* of the first waveguide member 10 can be attached at a location that can be finely adjusted in the range of the length of the elongate holes 24, so that electrical characteristics of the antenna body 320 can be finely adjusted. As a result, occurrence of disturbance of the pass amplitude characteristic in the band or disturbance of the return loss characteristic in the band due to total reflection can be suppressed.

The depressed portion 11 serving as the internal space 8 is a channel composed of three faces where inner surfaces formed at the central part in the longitudinal direction of the rectangular face 6*a* of the first waveguide member 10 are orthogonal to each other, and is configured to enable the second waveguide member 20 in an elongate plate shape to be attachable to or detachable from the face 6*a* with the screws 25. The internal space 8 is formed by fixing the second waveguide member 20 to the face 6*a* to close the depressed portion 11.

The coaxial waveguide converter 6 formed by assembling the second waveguide member 20 to the first waveguide member 10 is a cuboid or a cube including six faces, that is, the first face M1 to the sixth face M6 as described above.

The internal space 8 is formed through a part between the opposing first and second faces M1 and M2 of the coaxial waveguide converter 6. The connector fitting hole 22 for inserting a coaxial connector, that is communicated with the internal space 8 is formed through the third face M3 orthogonal to the first face and the second face. In the present example, the connector fitting hole 22 is formed through the second waveguide member 20.

The internal space 8 is open only on the side of the first face M1 due to closing (welding) of the opening on the second face side with a conductive closing member.

Holes 30*a* corresponding to screw holes 10*a* provided on an outer surface of the first waveguide member 10 are formed on the closing member 30 and the closing member 30 is closely fixed to the outer surface of the first waveguide member 10 with no space therebetween by inserting and threading screws 31 in a state where the screw holes 10*a* and the corresponding holes 30*a* are communicated with each other.

<Connector>

As illustrated in FIGS. 7 to 10, the connector 50 includes a conductive connector body 51 fitted to the connector fitting hole 22 to face outward from the internal space 8 and having an inner end portion 56*a* arranged in an exposed manner in a state not protruding into the internal space 8, a central conductor 60 arranged through a central part of the connector body in the y-axis direction and having a leading end portion 60*a* protruded from the inner end portion 56*a* of the connector body into the internal space 8 by a predetermined length L, and a radiator 54*b* formed of the leading end portion 60*a* of the central conductor protruded into the internal space 8 and radiating radio waves from the central conductor into the internal space 8 by adapting the protrusion length L (see FIG. 10) of the leading end portion to a specific frequency band. Male threads are formed on an outer circumference of one end of the connector body 51. The connector body and the central conductor are in an integrated relation via an insulating material.

While it has been explained above that the radiator 54*b* radiates radio waves, this is the effect at the time of transmission and the radiator 54*b* is assumed to absorb radio waves (receive power) at the time of reception.

As illustrated in FIGS. 10, the connector body 51 of the connector 50 according to the present example generally includes a connector socket portion 52 in a hollow tube shape constituted of a conductor and an insulator, a flange portion 53 integrated with one end of the connector socket portion 52, the central conductor 60 arranged through the connector socket portion 52 in the axial direction, a central-conductor support portion 55 that supports an appropriate place of the central conductor 60 to be fixed to an inner circumference of the connector socket portion 52, and an insulator 56 loaded to fill a space between the central conductor 60 and the inner circumference of the connector socket portion 52.

A connector-socket contact portion 54*a* is provided on an outer end portion of the central conductor 60, and the radiator 54*b* being an element is provided on an inner end portion of the central conductor. The radiator 54*b* is a site of the leading end portion of the central conductor 60 protruded from an inner end face of the connector socket portion 52 by a predetermined length, and is tuned to a predetermined frequency band by adjusting the length L of the element.

The length L of the central conductor 60 of the connector 50 in the y-axis direction protruded from the inner end portion 56*a* is a length obtained by multiplying ¼ of the wavelength of a specific frequency band by a predetermined shortening ratio 0.79. The specific frequency band is 24 GHz to 29 GHz, which is planned to be globally used by fifth generation terminals (5G).

Accordingly, the length L that enables dedicated tuning to a specific frequency band can be set.

In the present example, as illustrated in FIG. 9(*a*), a concave portion 23 for fitting the flange portion 53 of the connector is formed on an internal surface (a face opposite to the third face M3) of the second waveguide member 20. The end face of the flange portion 53 is designed in the dimension to be flush with the internal surface of the second waveguide member 20 when the connector socket portion 52 of the connector is inserted into the connector fitting hole 22 and the flange portion 53 is thereby fitted into the concave portion 23 and seated therein.

In this manner, the antenna body 320 closes the opening on the second face side of the internal space 8 of the coaxial waveguide converter 6 made of a conducting material with the conductive closing member 30, and has the protrusion length of the leading end portion 60*a* of the central conductor 60 protruded into the internal space 8 in the radiator 54*b* adapted to a specific frequency band. Therefore, tuning to the pass amplitude characteristic in the band or the return loss characteristic to the band can be achieved, and the cutoff performance can be enhanced, resulting in a more favorable EVM value.

The antenna body is a so-called square coaxial waveguide converter. One end of the coaxial cable is connected to the coaxial connector of each of the coupler antennas 300 and the other end of the coaxial cable is connected to any of the coaxial connectors 121 to 123 exposed outside the housing 100.

<Horizontally Polarized Waves·Vertically Polarized Waves>

The coupler antennas 300 illustrated in the present example handle linearly polarized waves in one direction. That is, each of the coupler antennas 300 takes a horizontally polarized attitude for receiving horizontally polarized waves or a vertically polarized attitude for receiving vertically polarized waves according to the inclination of the radiator 54*b*, and receives either the horizontally polarized waves or the vertically polarized waves. That is, the coupler antennas 300 receive the vertically polarized waves when the attitudes of the coupler antennas 300 are set to erect the radiator 54*b* extending along the Y axis perpendicularly to the ground surface (vertically polarized attitude), and the coupler antennas 300 receive the horizontally polarized waves when the attitudes of the coupler antennas 300 are set to erect the radiator 54*b* extending along the Y axis so as to extend in the horizontal direction along the ground surface (horizontally polarized attitude).

The first face M1 of the antenna body 320 is arranged to face the communication antennas being test objects mounted on the communication device 240. The coupler antennas 300 are desirably arranged in such a manner that the antenna beams 310 are substantially aligned with the central axis lines of the communication antennas mounted on the communication device 240.

<NFC Antenna Unit>

The NFC antenna unit 400 includes an antenna and an NFC antenna of 600 MHz to 6 GHz and a communication substrate, and is a device that performs a radio communication test between the NFC antenna unit 400 and an antenna that supports the Bluetooth (registered trademark) (2.4 GHz) and Wi-Fi (2.4 GHz and 5.2 GHz) mounted on the communication device 240, an antenna that supports 600 MHz to 4.5 GHz being sub-frequencies for the fifth generation communication (5G), and an NFC antenna.

The NFC antenna unit 400 may be caused to function as a means for transmitting/receiving a command for causing the communication device 240 to perform a specific operation required for a test, a response thereof, and the like using any of the Bluetooth (registered trademark), Wi-Fi, and the NFC communication. This eliminates the need to establish wired connection for transmitting/receiving a command to/from the communication device 240 and simplifies wiring in the test space S.

<Arrangement of Coupler Antennas>

The location relation between the communication antennas mounted on the communication device and the coupler antennas is explained with reference to FIG. 5.

In the following explanations, the directions of antenna beams defined in planes (a Z-X plane and a Y-Z plane) parallel to the Z axis are assumed as angles (elevation angles seen from each of the communication antennas) defined in a range from −90 degrees to +90 degrees with the location in the upper-lower direction of the communication antenna as a reference (0 degree).

The coupler antennas 300 are arranged to encompass the communication device 240 supported by the tray body 220. The coupler antennas 300 are placed to make the distances from a corresponding one of the communication antennas 250 included in the communication device 240 to be equal. Furthermore, the coupler antennas 300 may be arranged in either a horizontally polarized attitude or a vertically polarized attitude. Only the coupler antennas 300 for receiving horizontally polarized waves or only the coupler antennas 300 for receiving vertically polarized waves may be arranged in the test space S, or both types may be mixed.

<Upper-Lower Direction>

As illustrated in FIG. 5(*a*), a plurality of coupler antennas 300 (the coupler antenna arrays 300A and 300B: side coupler antenna arrays, coupler antenna groups) are arranged in the test space S at least in one row in a circumferential direction along the inner peripheral surface including the two side surfaces S1 and S2 in the width direction, the upper surface S3, and the lower surface S4 facing the test space S. The two coupler antenna arrays 300A and 300B constitute an inner-periphery coupler antenna array. The coupler antennas constituting the inner-periphery coupler antenna array are arranged at least in one row along a curve along the inner peripheral surface described above.

In this case, the "inner peripheral surface" means a face inside around the anechoic box forming the test space S, that is, a face encompassing the test space S and is not always limited to a circumferential face.

As illustrated in FIG. 5(*b*), a plurality of coupler antennas 300 (the coupler antenna array 300C: a rear coupler antenna array, a coupler antenna group) are arranged in the test space S at least in a row in the upper-lower direction along the rear surface S5 intersecting with (orthogonal to) the inner peripheral surface including the side surfaces S1 and S2, the upper surface S3, and the lower surface S4. The coupler antennas constituting the rear coupler antenna array are arranged at least in a row in the upper-lower direction along a direction intersecting with a curve along the inner peripheral surface.

In this case, "a row" does not mean one line in a strict sense where "the coupler antennas need to be in a same plane" and it suffices that the coupler antennas can be recognized as being arranged generally in a line.

The sign S6 denotes a front surface facing the test space S and the rear surface S5.

For example, in a case in which communication antennas 250*a* are placed on one end edge 243*a* in the width direction of the communication device 240 in a substantially rectangular plate shape as illustrated in FIG. 5(*a*), the coupler antenna arrays 300A each including a plurality of (at least three) coupler antennas 300 are correspondingly arranged on an end side in the width direction of the test space S. The coupler antennas 300 constituting each of the coupler antenna arrays 300A are respectively arranged at predetermined elevation angles, for example, at locations forming +65 degrees, +30 degrees, −30 degrees, and −65 degrees to the corresponding one of the communication antennas 250*a*. Distances La between each of the communication antennas 250*a* and the corresponding coupler antennas 300, 300, . . . are set to be equal (for example, 105 millimeters). That is, the coupler antennas 300, 300, . . . are arranged on an arc (on a circumference) with a radius La from the corresponding communication antenna 250*a* as a center. Antenna beams 310 of the coupler antennas 300 constituting each of the coupler antenna arrays 300A point the corresponding communication antenna 250*a* and a beam spot 311 on which the antenna beams 310 focus is arranged to overlap with the communication antenna 250*a*. In other words, the antenna beams 310 focus on the communication antenna 250*a* to form the beam spot 311 on the communication antenna 250*a*.

The coupler antennas 300 . . . constituting each of the coupler antenna arrays 300A are arranged along the lower surface S4, the side surface S1, and the upper surface S3. The coupler antennas 300 constituting the corresponding coupler antenna array 300A are arranged at least in a row in the upper-lower direction along the side surface S1.

The relation between communication antennas 250*b* arranged on the other end edge 243*b* in the width direction of the communication device 240 and the coupler antenna arrays 300B illustrated in FIG. 5(*a*) is identical to that described above.

That is, the coupler antenna arrays 300B each including a plurality of coupler antennas 300 are arranged on the other end side in the width direction of the test space S to correspond to the associated communication antennas 250*b* placed on the other end edge 243*b* in the width direction of the communication device 240. The coupler antennas 300 constituting each of the coupler antenna arrays 300B are respectively arranged at predetermined elevation angles, for example, at locations forming +65 degrees, +30 degrees, −30 degrees, and −65 degrees to the corresponding one of the communication antennas 250*b*. Distances Lb between each of the communication antennas 250*b* and the corresponding coupler antennas 300, 300, . . . are set to be equal (for example, 105 millimeters). That is, the coupler antennas 300, 300, . . . are arranged on an arc (on a circumference) with a radius Lb from the corresponding communication antenna 250*b* as a center. Antenna beams 310 of the coupler antennas 300 constituting each of the coupler antenna arrays 300B point the corresponding communication antenna 250*b* and a beam spot 311 on which the antenna beams 310 focus is arranged to overlap with the communication antenna 250*b*.

The coupler antennas 300 . . . constituting each of the coupler antenna arrays 300B are arranged along the lower surface S4, the side surface S2, and the upper surface S3. The coupler antennas 300 constituting the corresponding coupler antenna array 300B are arranged at least in a row in the upper-lower direction along the side surface S2.

The relation between communication antennas 250*c* placed on the upper end edge 243*c* of the communication device 240 illustrated in FIG. 5(*b*) and the coupler antenna arrays 300C is identical to that described above.

That is, the coupler antenna arrays (rear coupler antenna arrays) 300C each including a plurality of coupler antennas 300 are arranged on a rear end side of the test space S to correspond to the associated communication antennas 250*c* placed on the upper end edge 243*c* of the communication device 240. The coupler antennas 300 constituting each of the coupler antenna arrays 300C are respectively arranged at predetermined elevation angles, for example, at locations forming +65 degrees, +30 degrees, −30 degrees, and −65 degrees to the corresponding one of the communication antennas 250*c*. Distances Lc between each of the communication antennas 250*c* and the corresponding coupler antennas 300, 300, . . . are set to be equal (for example, 105 millimeters). That is, the coupler antennas 300, 300, . . . are arranged on an arc (on a circumference) with a radius Lc from the corresponding communication antenna 250*c* as a center. Antenna beams 310 of the coupler antennas 300 constituting each of the coupler antenna arrays 300C point the corresponding communication antenna 250*c* and a beam spot 311 on which the antenna beams 310 focus is arranged to overlap with the communication antenna 250*c*.

The coupler antennas 300 . . . constituting each of the coupler antenna arrays 300C are arranged along the lower surface S4, the rear surface S5, and the upper surface S3. The coupler antennas 300 constituting the corresponding coupler antenna array 300C are arranged at least in a row in the upper-lower direction along the rear surface S5.

The coupler antennas 300 arranged in a direction of the elevation angle of 0 degree in the coupler antenna arrays 300A to 300C will be explained in a second embodiment.

<Array 1 in Horizontal Plane>

A location relation between the communication antennas 250 and the coupler antennas 300 in a horizontal plane (the X-Y plane) is explained.

As illustrated in FIG. 5(*c*), the coupler antenna arrays 300A (300A1 to 300A3) and the coupler antenna arrays 300B (300B1 to 300B3) placed in end portions in the width direction of the test space S are respectively arranged in a plurality of rows along the front-back direction of the test space S. The coupler antenna arrays 300C (300C1 to 300C3) placed in a rear end portion of the test space S are arranged in a plurality of rows along the width direction of the test space S.

The coupler antenna arrays 300A1 to 300A3 are arranged to correspond to communication antennas 250*a*1 to 250*a*3 placed on the one end edge 243*a* in the width direction of the communication device 240, respectively. That is, the antenna beams 310 of the coupler antennas 300 constituting each of the coupler antenna arrays 300A1 to 300A3 point the corresponding one of the communication antennas 250*a*1 to 250*a*3, and each of the coupler antenna arrays 300A1 to 300A3 forms the beam spot 311 on the corresponding one of the communication antennas 250*a*1 to 250*a*3. The coupler antenna arrays 300A1 to 300A3 are arranged at same locations in the front-back direction as those of the communication antennas 250*a*1 to 250*a*3, respectively.

The coupler antenna arrays 300B1 to 300B3 are arranged to correspond to communication antennas 250*b*1 to 250*b*3 placed on the other end edge 243*b* in the width direction of the communication device 240, respectively. That is, the antenna beams 310 of the coupler antennas 300 constituting each of the coupler antenna arrays 300B1 to 300B3 point the corresponding one of the communication antennas 250*b*1 to 250*b*3, and each of the coupler antenna arrays 300B1 to 300B3 forms the beam spot 311 on the corresponding one of the communication antennas 250*b*1 to 250*b*3. The coupler antenna arrays 300B1 to 300B3 are arranged at same locations in the front-back direction as those of the communication antennas 250*b*1 to 250*b*3, respectively.

The coupler antenna arrays 300C1 to 300C3 are arranged to correspond to communication antennas 250*c*1 to 250*c*3 placed on the upper end edge 243*c* of the communication device 240, respectively. That is, the antenna beams 310 of the coupler antennas 300 constituting each of the coupler antenna arrays 300C1 to 300C3 point the corresponding one of the communication antennas 250*c*1 to 250*c*3, and each of the coupler antenna arrays 300C1 to 300C3 forms the beam spot 311 on the corresponding one of the communication antennas 250*c*1 to 250*c*3. The coupler antenna arrays 300C1 to 300C3 are arranged at same locations in the width direction as those of the communication antennas 250*c*1 to 250*c*3, respectively.

In the testing device 1 according to the present embodiment, the coupler antenna arrays 300A to 300C are arranged in the end portions in the width direction and the rear end portion. Therefore, once the communication device 240 is set in the test space S, all the communication antennas 250*a*, 250*b*, and 250*c* can be sequentially tested without ejecting the tray body 220 to outside to change the attitude of the communication device 240.

While the coupler antennas 300 set in a vertically polarized attitude are illustrated in FIG. 5(*c*), the coupler antennas 300 may be set in a horizontally polarized attitude depending on test contents, or coupler antennas 300 having a vertically polarized attitude and coupler antennas 300 having a horizontally polarized attitude may be alternately arranged.

<Array 2 in Horizontal Plane>

The location relation between the communication antennas 250 and the coupler antennas 300 in the horizontal plane (the X-Y plane) may be, for example, set as follows.

The coupler antenna arrays 300A1 and 300A3 may be coupler antenna arrays corresponding to the communication antenna 250*a*2. That is, antenna beams 310' and 310' of a plurality of coupler antennas 300 constituting the coupler antenna arrays 300A1 and 300A3 may point the communication antenna 250*a*2 to cause each of the coupler antenna arrays 300A1 and 300A3 to form the beam spot 311 on the communication antenna 250*a*2.

In this case, it is desirable that the coupler antenna arrays 300A1 and 300A3 are arranged at different locations in the front-back direction from that of the communication antenna 250*a*2 and that the distances between the coupler antennas 300 constituting each of the coupler antenna arrays 300A1 and 300A3 and the communication antenna 250*a*2 are equal. It is also desirable to arrange the coupler antenna arrays 300A1 and 300A3 to cause the antenna beams 310' and 310' of the coupler antennas 300 constituting the coupler antenna arrays 300A1 and 300A3 to have a line-symmetric location relation with respect to a reference antenna beam (0 degree of the beam forming angle) emitted from the communication antenna 250*a*2.

When the coupler antennas are arranged in this manner, it is also possible to constitute one coupler antenna array 300A1 of coupler antennas 300 in a horizontally polarized attitude and constitute the other coupler antenna array 300A3 of coupler antennas 300 in a vertically polarized attitude.

The coupler antenna arrays 300B1 to 300B3 arranged in the other end portion in the width direction of the test space S and the coupler antennas antenna arrays 300C1 to 300C3 arranged in the rear end portion of the test space S may be identically set.

<Location Determination of Coupler Antennas>

When the distances between each of the communication antennas 250 and the corresponding coupler antennas 300 are uniform, the reception levels of the antenna beams are higher in coupler antennas 300 at an angle closer to the central axis of the antenna beams emitted from the communication antenna 250. Conversely, as the deviation from the central axis of the antenna beams emitted from each of the communication antennas 250 is larger, the reception levels of the antenna beams received by the corresponding coupler antennas 300 are lower.

Therefore, the locations of the coupler antennas 300, 300, . . . are respectively set at locations where, when the corresponding communication antenna 250 emits an antenna beam to a certain one of the coupler antennas 300, the reception levels of other coupler antennas 300 adjacent thereto are sufficiently attenuated relative to the reception level of the certain coupler antenna. The locations where the reception levels are sufficiently attenuated are locations where the reception levels of radio waves received by the coupler antennas 300 can be distinguishably observed on a characteristic graph and are set, for example, with reference to locations where lines of graphs indicating the frequencies-reception levels of the coupler antennas do not overlap with each other.

<Frame Unit>

A frame unit supporting the coupler antennas and the NFC antenna units is explained.

Figure 11:
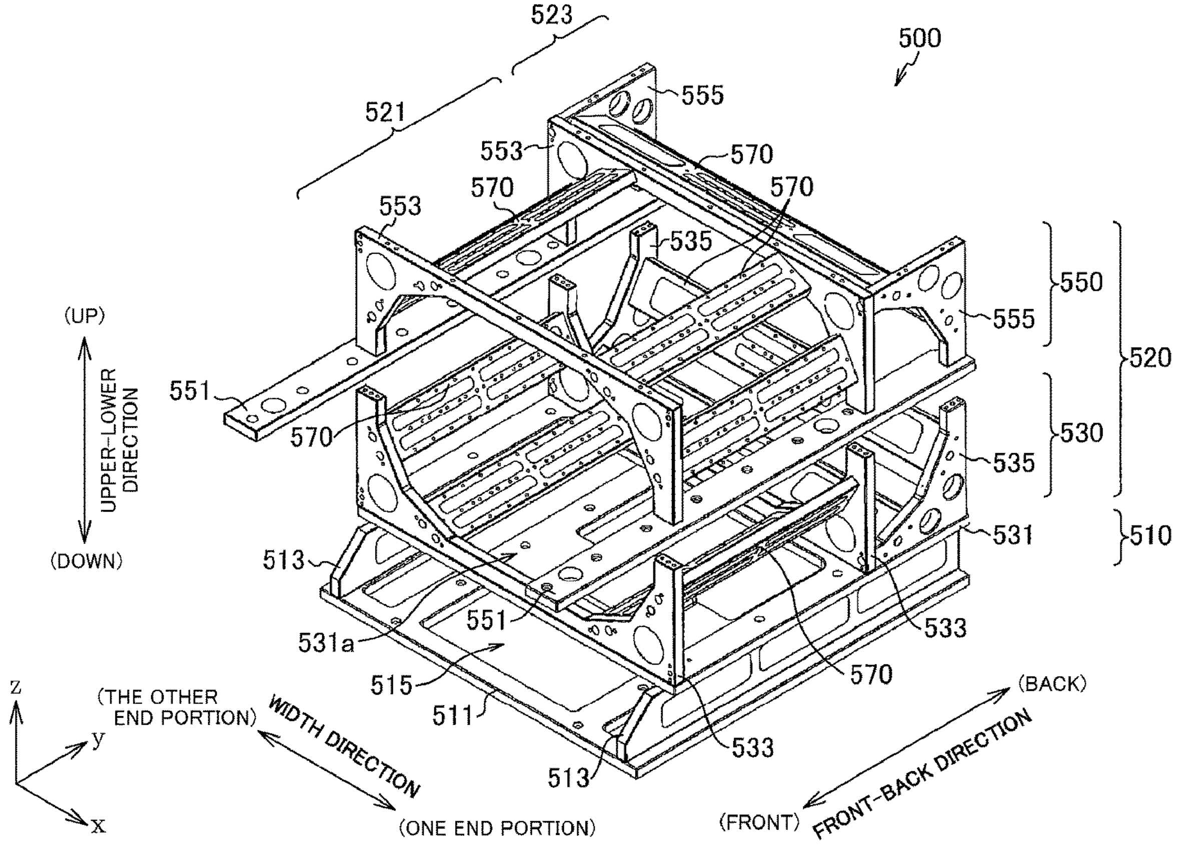
FIG. 11 is a perspective view illustrating a frame unit according to the first embodiment of the present invention.

FIG. 11 is a perspective view illustrating a frame unit according to the first embodiment of the present invention.

A frame unit 500 includes a bottom frame 510 placed in a lowermost part, and a coupler support frame (coupler support unit) 520 placed above the bottom frame 510. The coupler support frame 520 illustrated in the present example includes a lower frame 530 placed just above the bottom frame 510 and an upper frame 550 placed above the lower frame 530, and has a configuration divided into two in the upper-lower direction.

The coupler support frame 520 supports a plurality of coupler attachment frames (coupler support units) 570 in a substantially band plate shape having a predetermined thickness.

The coupler support frame 520 is configured to include a front frame 521 placed in a front part of the frame unit 500, and a rear frame 523 placed in a rear part thereof in the front-back direction. The front frame 521 is configured to include lower front frames 533 and upper front frames 553 described later, and the rear frame 523 is configured to include lower rear frames 535 and upper rear frames 555 described later.

<Bottom Frame>

The bottom frame 510 includes a bottom base 511 placed on the bottom surface in the test space S, and bottom side frames 513 and 513 erecting from both end portions in the width direction of the bottom base 511. The bottom side frames 513 form a second antenna housing space 515 that houses the NFC antenna unit 400 on the bottom base 511.

The bottom base 511 is fixed at an appropriate place on the bottom surface of the housing 100.

The NFC antenna unit 400 is attached to a central part of the bottom base 511. The communication device 240 is positioned by the tray body 220 so as to be arranged just above the NFC antenna unit 400.

<Lower Frame>

The lower frame 530 includes a lower base 531 fixed onto the bottom side frames 513 and 513 of the bottom frame 510, a pair of the lower front frames 533 and 533 fixed onto the lower base 531 in the front part of the lower base 531 with a predetermined distance in the front-back direction from each other, and a pair of the lower rear frames 535 and 535 fixed onto the lower base 531 in the rear end portion of the lower base 531 with a predetermined distance in the width direction from each other.

The lower base 531 is fixed to the bottom side frames 513 and 513 at the both end portions in the width direction, respectively. The lower base 531 includes an opening 531*a* on a face opposing the NFC antenna unit 400.

The lower front frames 533 and 533 support both end portions in the longitudinal direction of the coupler attachment frames 570, 570, . . . . That is, the coupler attachment frames 570 are supported at the end portions in the longitudinal direction by the lower front frames 533 and 533 so as to extend in the front-back direction.

In the present example, the lower front frames 533 and 533 support four coupler attachment frames 570 . . . . Each of the coupler attachment frames 570 is supported by the lower front frames 533 and 533 at a predetermined angle in such a manner that one surface faces the communication device 240 mounted on the tray body 220. This angle is set to an angle that enables the coupler attachment frame 570 to support the coupler antennas 300 at a predetermined elevation angle (for example, −30 degrees or −65 degrees) with respect to the associated communication antenna.

The lower rear frames 535 and 535 are arranged on both end portions in the width direction of the rear end portion of the lower base 531.

The lower rear frames 535 and 535 support both end portions in the longitudinal direction of the coupler attachment frames 570, 570, . . . . That is, each of the coupler attachment frames 570 is supported at the end portions in the longitudinal direction by the lower rear frames 535 and 535 so as to extend in the width direction.

In the present example, the lower rear frames 535 and 535 support two coupler attachment frames 570 . . . . Each of the coupler attachment frames 570 is supported by the lower rear frames 535 and 535 at a predetermined angle in such a manner that one surface faces the communication device 240 mounted on the tray body 220. This angle is set to an angle that enables the coupler attachment frame 570 to support the coupler antennas 300 at a predetermined elevation angle (for example, −30 degrees or −65 degrees) with respect to the associated communication antenna.

<Upper Frame>

The upper frame 550 includes upper bases 551 and 551 fixed at appropriate places in end portions in the width direction of the housing 100 and extending in the front-back direction, a pair of the upper front frames 553 and 553 fixed onto the upper bases 551 and 551 with a predetermined distance from each other in the front-back direction in an intermediate part in the longitudinal direction of the upper bases 551 and 551, and a pair of the upper rear frames 555 and 555 fixed onto the upper bases 551 and 551 with a predetermined distance from each other in the width direction in rear parts of the upper bases 551 and 551.

The upper bases 551 and 551 are in a substantially band plate shape having a predetermined thickness and are fixed to intermediate parts in the upper-lower direction on the internal surfaces of the housing 100 located on the both end portions in the width direction in the present example. As illustrated in FIG. 3, the upper bases 551 and 551 are arranged at locations not interfering with the inner guide rails 153 and the inner sliders 233.

The upper front frames 553 and 553 support the both end portions in the longitudinal direction of the coupler attachment frames 570, 570, . . . . That is, the coupler attachment frames 570 are supported at the end portions in the longitudinal direction by the upper front frames 553 and 553 so as to extend in the front-back direction.

In the present example, the upper front frames 553 and 553 support four coupler attachment frames 570 . . . . Each of the coupler attachment frames 570 is supported by the upper front frames 553 and 553 at a predetermined angle in such a manner that one surface faces the communication device 240 mounted on the tray body 220. This angle is set to an angle that enables the coupler attachment frame 570 to support the coupler antennas 300 at a predetermined elevation angle (for example, +30 degrees or +65 degrees) with respect to the associated communication antenna.

The upper rear frames 555 and 555 are arranged on both end portions in the width direction of the rear end portions of the upper bases 551 and 551, respectively.

The upper rear frames 555 and 555 support both end portions in the longitudinal direction of the coupler attachment frames 570, 570, . . . . That is, the coupler attachment frames 570 are supported at the end portions in the longitudinal direction by the upper rear frames 555 and 555 so as to extend in the width direction.

In the present example, the upper rear frames 555 and 555 support two coupler attachment frames 570 . . . . Each of the coupler attachment frames 570 is supported by the upper rear frames 555 and 555 at a predetermined angle in such a manner that one surface faces the communication device 240 mounted on the tray body 220. This angle is set to an angle that enables the coupler attachment frame 570 to support the coupler antennas 300 at a predetermined elevation angle (for example, +30 degrees or +65 degrees) with respect to the associated communication antenna.

<Coupler Attachment Frames>

Figure 12:
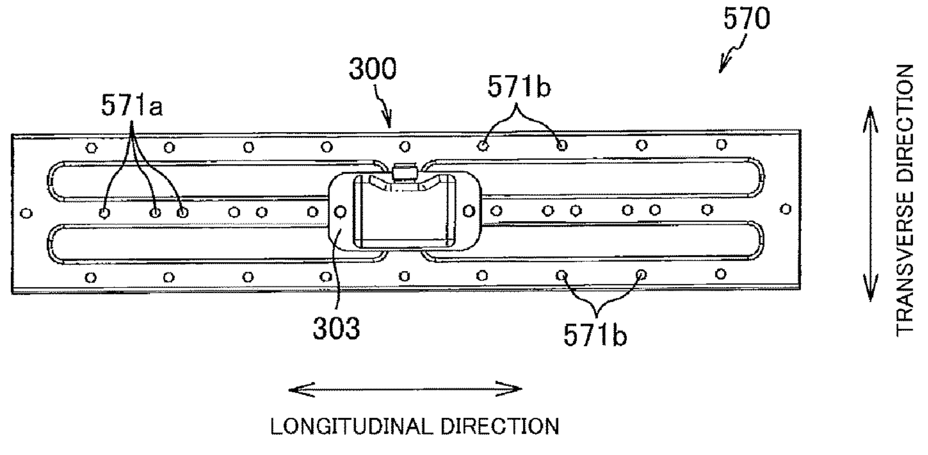
FIG. 12 is a front view illustrating a coupler attachment frame.

FIG. 12 is a front view illustrating the coupler attachment frame.

Each of the coupler attachment frames 570 supports a plurality of coupler antennas 300. The coupler attachment frames 570 are each configured to enable the associated coupler antennas 300 to be selectively attached and detached. Each of the coupler attachment frames 570 is configured to enable the associated coupler antennas 300 to be selectively attached in a horizontally polarized attitude or a vertically polarized attitude.

The coupler attachment frames 570 are in a substantially band plate shape having a predetermined thickness. A plurality of screw holes 571 (571*a* and 571*b*) are formed on each of the coupler attachment frames 570 and the attachment base 303 of each of the coupler antennas 300 is screwed and fixed to the associated coupler attachment frame 570. The screw holes 571*a* arranged in an intermediate part in the transverse direction of each of the coupler attachment frames 570 are screw holes for attaching the coupler antennas 300 in a vertically polarized attitude (an attitude illustrated in FIG. 12) and the screw holes 571*b* arranged on both end portions in the transverse direction are screw holes for attaching the coupler antennas 300 in a horizontally polarized attitude. The horizontally polarized attitude is equal to an attitude obtained by turning the coupler antenna 300 in a vertically polarized attitude by 90 degrees.

In this manner, the coupler antennas 300 can be attached to the coupler attachment frames 570 in either a vertically polarized attitude or a horizontally polarized attitude.

The locations of the screw holes 571 formed on the coupler attachment frames 570 may be adjusted for each communication device 240 according to the locations of the communication antennas 250 mounted on the communication device 240.

<Effects>

As described above, according to the present embodiment, characteristic tests on the communication antennas 250 are performed in a near field range of radio waves transmitted/received by the communication antennas 250 being test objects or a close range where the communication antennas 250 and the coupler antennas 300 are close to each other (a limit distance where the level differences among the coupler antennas are detectable when beams are emitted to the coupler antennas), so that the testing device 1 can be downsized.

Since the testing device 1 is removably mounted on a 19-inch rack, the testing device 1 can be mounted on the 19-inch rack along with other devices required for the characteristic tests on the communication antennas 250. Therefore, a set of test systems can be packed in a compact manner.

The tray body 220 is inserted into the test space S and is ejected out of the test space S in a state where the communication device 240 including the communication antennas 250 being the test objects is mounted on the tray body 220. Therefore, the communication device 240 is easily installed in the test space S.

Since the coupler antennas 300 are arranged three-dimensionally so as to surround the communication antennas 250, plural types of characteristic tests can be performed without changing the arrangement of the communication device 240. Furthermore, any of the communication device 240 and the coupler antennas 300 do not need to be moved during the tests and accordingly the internal configuration of the testing device 1 can be simplified.

Second Embodiment

A testing device according to a second embodiment of the present invention is characterized in that the tray body is cantilevered by a panel portion and that the inner guide rails and the inner sliders are omitted, thereby enabling the coupler antennas to be arranged in a direction of the elevation angle of 0 degree with respect to the corresponding communication antennas.

The testing device illustrated in the present embodiment is a testing device suitable for performing characteristic tests on a mobile communication terminal such as a smartphone.

In the following descriptions, members identical to those of the first embodiment are denoted by like reference signs and explanations thereof are omitted as appropriate.

<Tray Unit>

Figure 13:
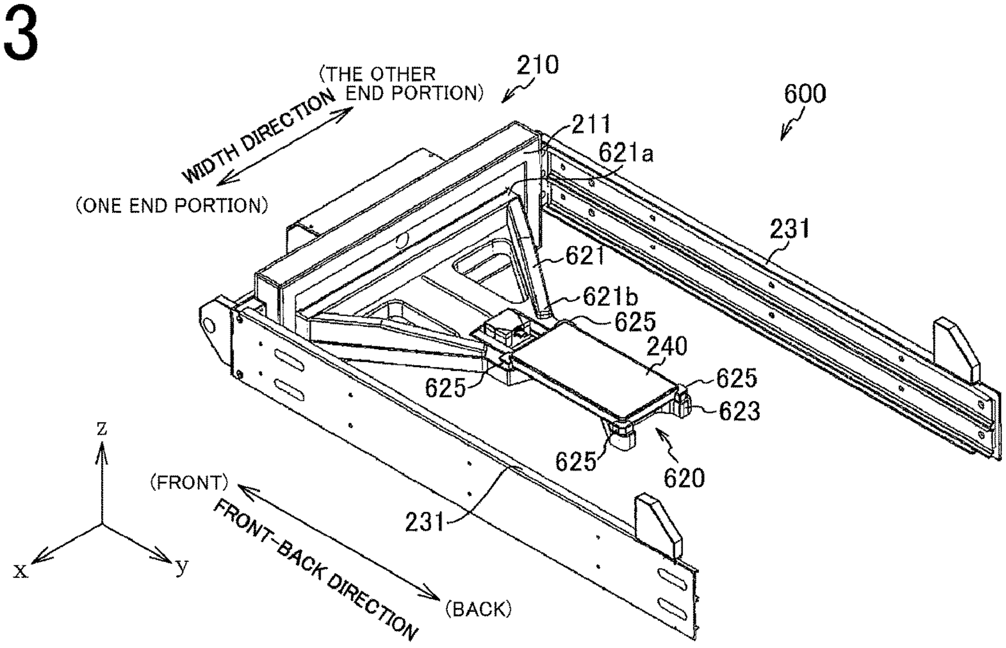
FIG. 13 is a perspective view of a tray unit according to a second embodiment of the present invention, observed from the back side.

FIG. 13 is a perspective view of a tray unit according to the second embodiment of the present invention, observed from the back side.

A tray unit (the communication device support unit) 600 includes a tray body 620 protruded backward from the rear surface of the panel portion 210, and outer sliders 231 that engage with the outer guide rails 151 to move the tray unit 600 back and forth in the front-back direction.

The tray body 620 includes an arm portion 621 that has a front end portion 621*a* supported by the panel portion 210 and that is protruded backward, and a mount portion 623 that is supported by a rear end portion 621*b* of the arm portion 621 and on which the communication device 240 is mounted.

The mount portion 623 includes a positioning member 625 that positions the communication device 240 at a predetermined location and in a predetermined attitude in the test space S. The positioning member 625 is, for example, provided to be attached to each corner of the communication device 240 in a substantially rectangular plate shape.

The arm portion 621 also functions as a unit that leads wired cables such as communication cables connected to the communication device 240 to the USB connectors 215 (see FIG. 4) provided on the panel portion 210.

In the present example, the tray body 620 is cantilevered by the panel portion 210 and the side of the mount portion 623 located in the rear end portion is formed as a free end. Therefore, the tray body 620 does not need to include the inner sliders 233 (see FIG. 4) as illustrated in the tray unit 200 of the first embodiment. Further, the inner guide rails 153 (see FIG. 3) that engage with the inner sliders 233 do not need to be provided in the test space S.

<Frame Unit>

Figure 14:
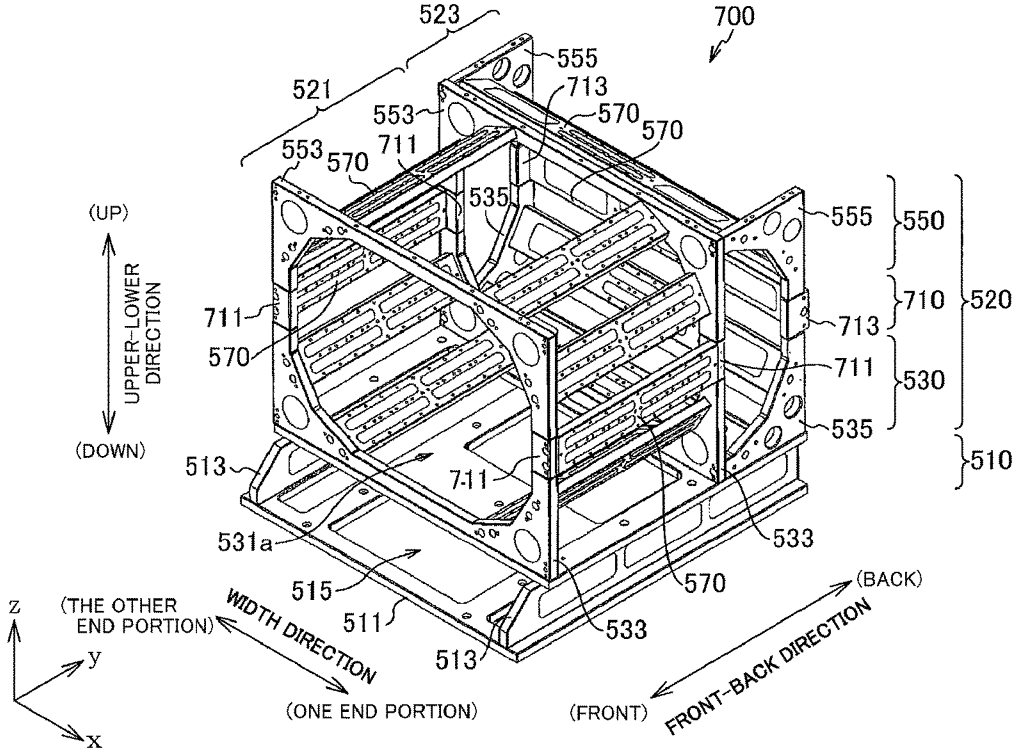
FIG. 14 is a perspective view illustrating a frame unit according to the second embodiment of the present invention.

FIG. 14 is a perspective view illustrating a frame unit according to the second embodiment of the present invention.

The coupler support frame 520 constituting a frame unit 700 illustrated in the present example includes the lower frame 530, the upper frame 550, and an intermediate frame 710 located between these frames. The upper frame 550 illustrated in the present example is different from that in the first embodiment in not including the upper bases 551 (see FIG. 11). The upper frame 550 is supported by the lower frame 530 with the intermediate frame 710 interposed therebetween.

The intermediate frame 710 is configured to include four intermediate front frames 711 inserted between the lower front frames 533 and the upper front frames 553, and two intermediate rear frames 713 inserted between the lower rear frame 535 and the upper rear frame 555.

The intermediate front frames 711 support the both end portions in the longitudinal direction of the associated coupler attachment frames 570 in such a manner that the coupler attachment frames 570 extend in the front-back direction in respective end portions in the width direction. The intermediate rear frames 713 support the both end portions in the longitudinal direction of the associated coupler attachment frames 570 in such a manner that the coupler attachment frames 570 extend in the width direction in the rear end portion.

The intermediate frame 710 and three coupler attachment frames 570 supported by the intermediate frame 710 are arranged at equivalent locations in the upper-lower direction to that of the communication device 240 (see FIG. 13) supported by the tray body 620. Therefore, in the present embodiment, the coupler antennas 300 are arranged also in the direction of the elevation angle of 0 degree with respect to the communication antennas 250 (see FIGS. 5(*a*) and 5(*b*)).

In this manner, the present embodiment is configured to cantilever the tray body 620 only with the panel portion 210 and omit the inner guide rails 153 and the inner sliders 233 (see FIG. 3). Therefore, the intermediate frame 710 can be arranged at the corresponding site and the coupler antennas 300 can be arranged in the direction of the elevation angle of 0 degree with respect to the communication device 240. That is, the tray unit 600 has a configuration in which coupler antennas can be arranged in a coupler antenna array corresponding to the horizontal direction of the communication antennas included in the communication device.

With the testing device according to the present embodiment, more detailed characteristic tests can be performed relative to the testing device described in the first embodiment.

Third Embodiment

Figure 15:
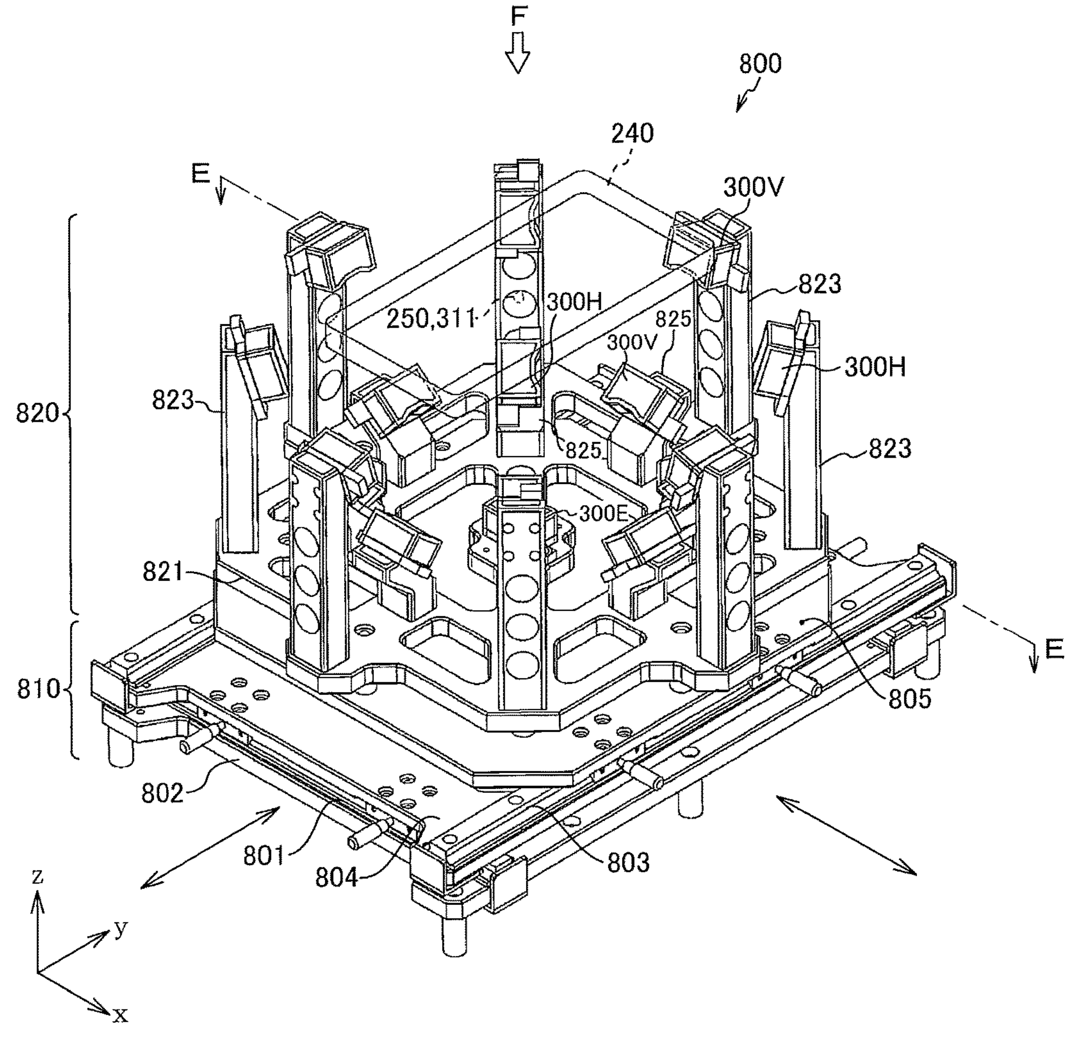
FIG. 15 is a perspective view illustrating a coupler unit according to a third embodiment of the present invention.
Figure 16:
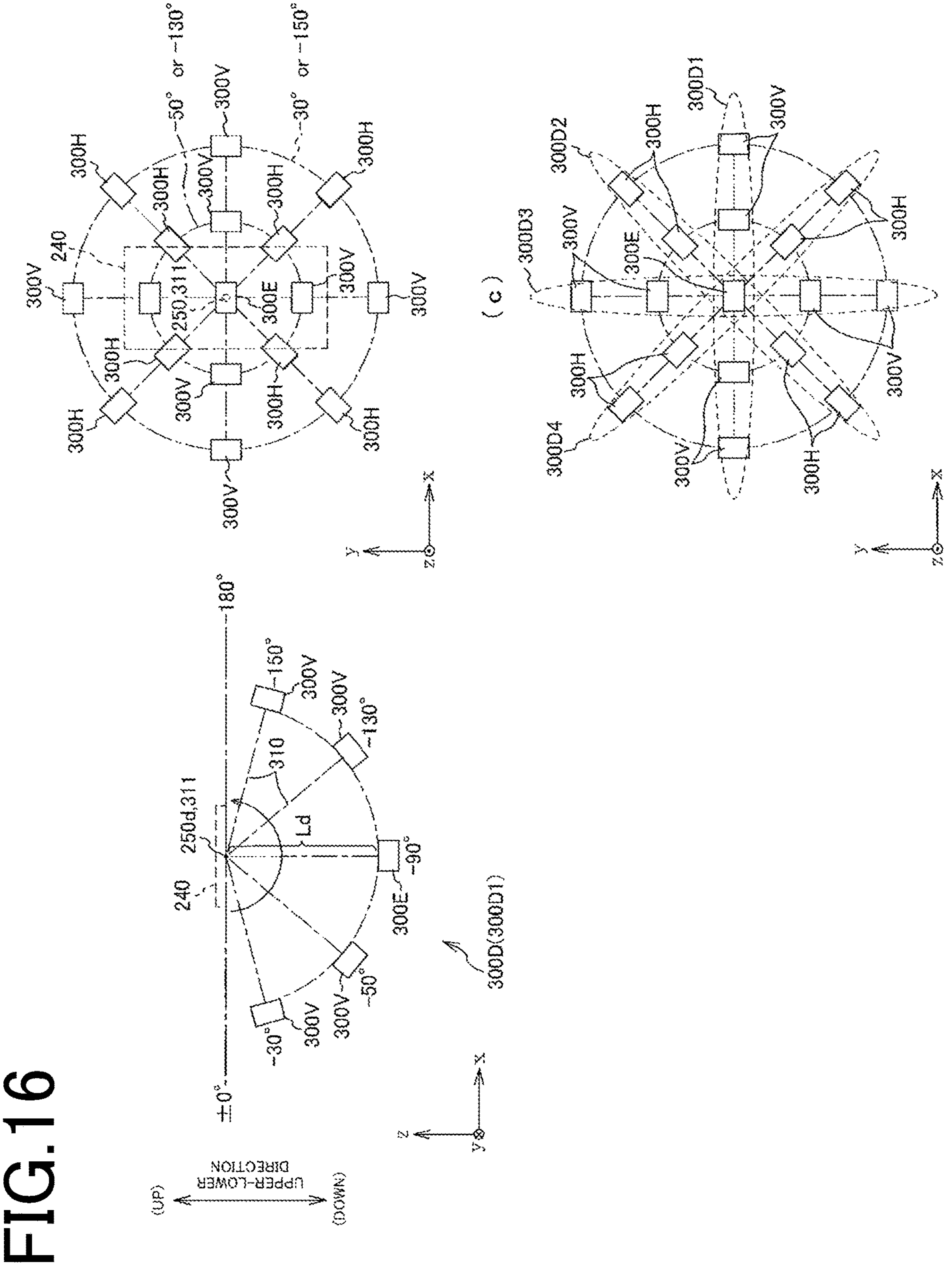
FIG. 16 are schematic views illustrating arrangement of coupler antennas, where FIG. 16(*a*) is a schematic view illustrating arrangement of the coupler antennas in a vertical plane, and FIGS. 16(*b*) and 16(*c*) are schematic views illustrating planar arrangement of the coupler antennas.

FIG. 15 is a perspective view illustrating a coupler unit according to a third embodiment of the present invention. FIG. 16 are schematic views illustrating arrangement of coupler antennas, where FIG. 16(*a*) is a schematic view illustrating arrangement of the coupler antennas in a vertical plane, and FIGS. 16(*b*) and 16(*c*) are schematic views illustrating planar arrangement of the coupler antennas. FIG. 16(*a*) is a diagram illustrating arrangement of the coupler antennas corresponding to an E-E plane in FIG. 15, and FIGS. 16(*b*) and 16(*c*) are diagrams illustrating arrangement of the coupler antennas corresponding to a diagram viewed from an arrow F in FIG. 15.

A testing device illustrated in the present embodiment is a testing device suitable for performing characteristic tests on a base station or a communication module alone.

The present embodiment is characterized in that a plurality of coupler antennas are arranged hemispherically (on a hemispherical face). In the following descriptions, members identical to those of the first and second embodiments are denoted by like reference signs and explanations thereof are omitted as appropriate.

In the present embodiment, a coupler unit 800 (a coupler support unit) that supports the coupler antennas 300 is placed just below the tray body 220 of the tray unit 200 illustrated in FIG. 4 or the tray body 620 of the tray unit 600 illustrated in FIG. 13.

<Arrangement of Coupler Antennas>

A location relation between the communication device and the coupler antennas is explained with reference to FIG. 16.

The communication antennas 250 are arranged at appropriate places on one face (a lower surface) of the communication device 240 in an attitude illustrated in FIG. 16 and emit radio waves downward in the drawings.

Coupler antenna arrays 300D (coupler antenna groups) including a plurality of coupler antennas 300 (300E, 300H, and 300V) are each arranged in a row on an arc (along an arc) around each of the communication antennas 250 in the test space S. A plurality of coupler antenna arrays 300D1 to 300D4 are arranged equiangularly (every 45 degrees of the azimuth) around each communication antenna in the test space S. That is, in the present example, the coupler antennas 300 are arranged hemispherically (on a hemispherical face) around each of the communication antennas 250.

The coupler antennas 300 constituting each of the coupler antenna arrays 300D are respectively arranged at predetermined elevation angles, for example, at locations forming −30 degrees, −50 degrees, −90 degrees, −130 degrees, and −150 degrees with respect to the corresponding communication antenna 250. The distances Ld between each of the communication antennas 250 and the associated coupler antennas 300, 300, . . . are set to be equal (for example, 105 millimeters). That is, the coupler antennas 300, 300, . . . constituting each of the coupler antenna arrays 300D are arranged on an arc (on a circumference) with a radius Ld around the communication antenna 250*a*. The antenna beams 310 of the coupler antennas 300 constituting each of the coupler antenna arrays 300D point the associated communication antenna 250 and the beam spot 311 on which the antenna beams 310 focus is arranged so as to overlap with a communication antenna 250*d*.

The coupler antenna 300E is placed just below each of the communication antennas 250. The coupler antennas 300E have either a horizontally polarized attitude or a vertically polarized attitude.

The coupler antenna arrays 300D1 and 300D3 are each constituted of the coupler antenna 300E and the coupler antennas 300V having a vertically polarized attitude. The coupler antenna arrays 300D2 and 300D4 are each constituted of the coupler antenna 300E and the coupler antennas 300H having a horizontally polarized attitude. Therefore, the coupler antennas 300 include the coupler antennas 300V in a vertically polarized attitude and the coupler antennas 300H in a horizontally polarized attitude, which are alternately arranged in a circumferential direction in a planar view.

The coupler antenna 300E arranged just below each of the communication antennas 250 is preferably used in the power measurement test and the EVM measurement test.

<Coupler Unit>

Referring back to FIG. 15, the coupler unit 800 includes an XY stage 810 fixed to the bottom part of the housing 100, and a coupler support member 820 supported by the XY stage 810. The coupler support member 820 includes a fixed base 821 fixed to the XY stage 810, and a plurality of support arms 823 and 825 erecting from the fixed base 821.

The XY stage 810 is a means for horizontally moving the coupler support member 820 in the test space S.

The XY stage 810 includes a stage base 802 that is fixed to the bottom part of the housing 100 and that includes an X-direction rail 801 extending along the X-axis direction, an X stage 804 that includes a Y-direction rail 803 extending along the Y-axis direction and that reciprocates in the X-axis direction on the stage base 802 due to the X-direction rail 801, and a Y stage 805 that reciprocates in the Y-axis direction on the X stage 804 due to the Y-direction rail 803.

The XY stage 810 is a known means for moving the coupler support member 820 to a certain X-direction location and a certain Y-direction location in the test space S, and fixing the coupler support member 820 to the location.

The XY stage 810 can move the coupler support member 820 to cause the beam spot 311 to match the location of the associated communication antenna 250 of the communication device 240. That is, a range of motion of the XY stage 810 is set within a range where the beam spot 311 can be matched with a certain planar location of the communication device 240.

The fixed base 821 is a means for supporting the support arms 823 and 825. The coupler antenna 300E is removably screwed to the central part of the fixed base 821.

The support arms 823 and 825 are means for supporting the coupler antennas 300V and 300H to the fixed base 821 at predetermined locations in the upper-lower direction and predetermined elevation angles. The coupler antennas 300V and 300H are removably screwed to leading end portions of the support arms 823 and 825. The support arms 823 and 825 can support the coupler antennas 300 in either a vertically polarized attitude or a horizontally polarized attitude.

The support arms 823 are means for supporting the coupler antennas 300V and 300H at locations and elevation angles where the elevation angles are −30 degrees or −150 degrees. The support arms 825 are means for supporting the coupler antennas 300V and 300H at locations and elevation angles where the elevation angles are −50 degrees or −130 degrees. The support arms 823 and 825 are arranged concentrically at predetermined intervals around the coupler antenna 300E.

<Effects>

According to the present embodiment, in a case in which the communication device 240 includes a plurality of communication antennas 250 in one plane, the coupler unit can be moved to correspond to each of the communication antennas. Further, the coupler antennas are arranged hemispherically around one communication antenna. Therefore, when antenna beams are emitted from a test target antenna to the associated coupler antennas, the space loss to the coupler antennas are uniform, so that the reception levels of received radio waves can be corrected with a certain value and various characteristic values can be easily obtained.

Fourth Embodiment

Figure 17:
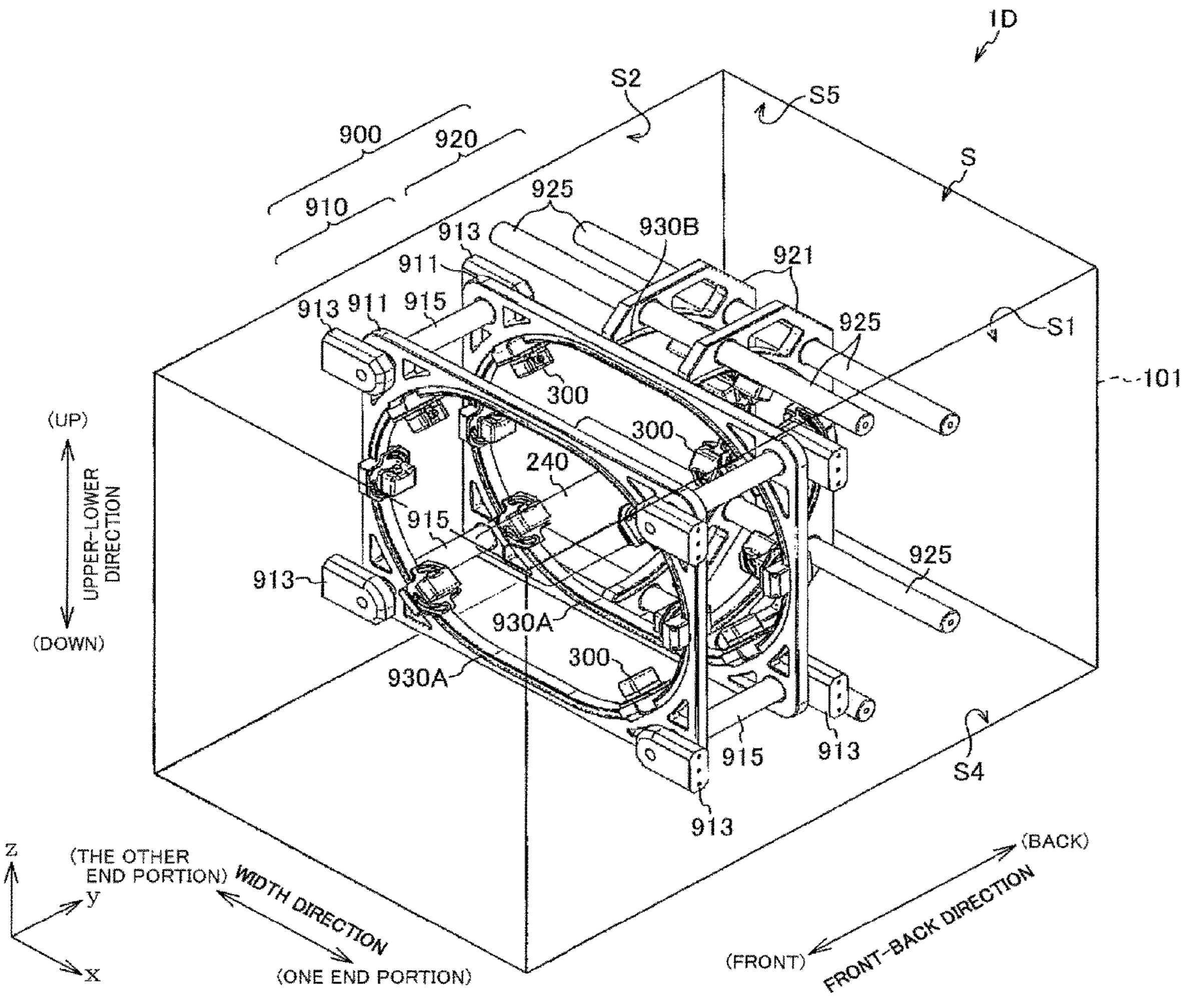
FIG. 17 is a perspective view illustrating a coupler unit according to a fourth embodiment of the present invention.

FIG. 17 is a perspective view illustrating a frame unit according to a fourth embodiment of the present invention.

A testing device according to the present embodiment is characterized in that coupler antennas constituting each coupler antenna array are supported slidably along a direction in which the associated coupler antenna array extends.

In the following descriptions, members identical to those of the first to third embodiments are denoted by like reference signs and explanations thereof are omitted as appropriate.

<Outline of Coupler Unit>

A testing device 1D includes a coupler unit 900 (a coupler support unit) that supports a plurality of coupler antennas 300, 300, . . . in the test space S. The coupler unit 900 enables a group of coupler antennas 300, 300, . . . to be arranged in a row on an arc around an associated (or facing) one of the communication antennas 250 (test target antennas).

The coupler unit 900 is configured to include a front unit 910 placed in a front part of the coupler unit 900, and a rear unit 920 placed in a rear part of the coupler unit 900. The front unit 910 and the rear unit 920 each include guide rails 930 (930A and 930B) that support the coupler antennas 300 to be movable back and forth along a direction in which the associated coupler antenna array extends.

<Front Unit>

The front unit 910 includes a plurality of front slide frames 911 and 911 that each include the guide rail 930A and that are arranged away from each other in the front-back direction, a plurality of housing attachment pieces 913, 913, . . . that fix the front slide frames 911 and 911 to the housing body 101, the coupler antennas 300 attached to the front slide frames 911 and 911, and cable guides 915, 915, . . . that support cables connected to the coupler antennas 300.

The coupler antennas 300, 300, . . . attached to each of the front slide frames 911 and 911 constitute an inner-periphery coupler antenna array.

Figure 18:
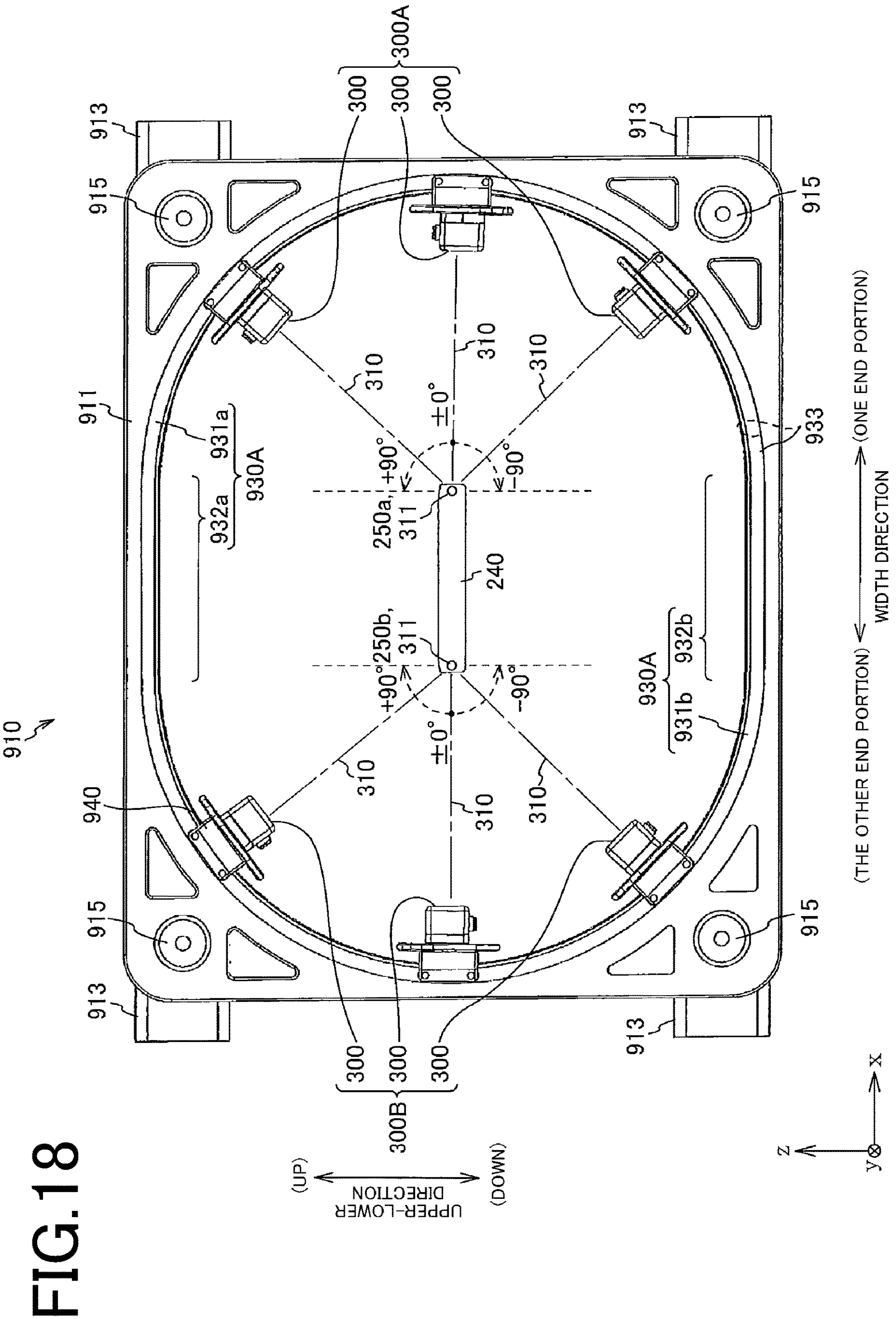
FIG. 18 is a front view of a front slide frame.

FIG. 18 is a front view of the front slide frame.

The front slide frames 911 each have a substantially rectangular frame shape in a front view. The front slide frames 911 and 911 are arranged at predetermined locations in the front-back direction in the test space S. The housing attachment pieces 913, 913, . . . are fixed to four corner portions of each of the front slide frames 911. The housing attachment pieces 913, 913, . . . fix the associated front slide frames 911 to side surfaces of the housing body 101 at predetermined locations in the front-back direction.

The cable guides 915, 915, . . . are members in a round bar shape extending in the front-back direction and connect the corresponding corner portions of the both front slide frames 911 and 911 to each other. The cable guides 915, 915, . . . also function as distance maintaining members that maintain the both front slide frames 911 and 911 at a predetermined distance.

The annular guide rail 930A is formed on the inner circumferential part of each of the front slide frames 911. The guide rail 930A illustrated in the present example is configured to include a pair of guide grooves 933 formed on a front surface and a rear surface of each of the front slide frames 911.

The guide rail 930A is placed in an endless manner along the inner peripheral surface composed of the two opposing two side surfaces S1 and S2, the upper surface S3, and the lower surface S4 of the test space S. That is, the coupler antennas 300, 300, . . . supported by the guide rail 930A to be movable back and forth constitute an inner-periphery coupler antenna array. Since the guide rail 930A is endless, the coupler antennas 300 can be moved to any location on the guide rail 930A.

The guide rail 930A has a substantially oval shape in a front view. The guide rail 930A includes arc-like curved portions 931 (931*a* and 931*b*) extending in the upper-lower direction in both end portions in the width direction, and connecting portions 932 (932*a* and 932*b*) connecting end portions in the longitudinal direction of both of the curved portions 931*a* and 931*b* in intermediate portions in the width direction. The connecting portions 932*a* and 932*b* connect the curved portions 931*a* and 931*b* to constitute the guide rail 930A in an endless manner. The connecting portions 932*a* and 932*b* linearly extend in the width direction.

In the test space S, the communication antennas 250*a* and 250*b* mounted on the communication device 240 are arranged in such a manner that the locations of the communication antennas 250*a* and 250*b* in the front-back direction in the test space S match the location in the front-back direction of the associated front slide frame 911 in the test space S. The front slide frames 911 surround the communication device 240.

The coupler antennas 300, 300, . . . arranged at certain locations on the curved portion 931*a* form the coupler antenna array 300A (a coupler antenna group) arranged in a row on an arc around the communication antenna 250*a*. The coupler antenna array 300A is configured to include at least three coupler antennas 300. The distances between the coupler antennas 300 and the communication antenna 250*a* are equal. The coupler antennas 300, 300, . . . constituting the coupler antenna array 300A form the beam spot 311 on the corresponding communication antenna 250*a*.

Similarly, the coupler antennas 300, 300, . . . arranged at certain locations on the curved portion 931*b* form the coupler antenna array 300B (a coupler antenna group)

arranged in a row on an arc around the communication antenna 250*b*. The coupler antenna array 300B is configured to include at least three coupler antennas 300. The distances between the coupler antennas 300 and the communication antenna 250*b* are equal. The coupler antennas 300, 300, . . . constituting the coupler antenna array 300B form the beam spot 311 on the corresponding communication antenna 250*b*.

The curved portions 931 respectively move the associated coupler antennas 300 back and forth along a circumferential direction around the corresponding communication antennas 250. The curved portions 931 arrange the coupler antennas 300 in desired angular directions (elevation angles) with respect to the corresponding communication antennas 250. The curved portions 931 illustrated in the present example move the coupler antennas 300 in a range of elevation angles from −90 degrees to +90 degrees.

The connecting portions 932 move the associated coupler antennas 300 back and forth horizontally in the width direction. The connecting portions 932 arrange the coupler antennas 300 . . . just above or just below the communication device 240. The distances between the communication device 240 and the coupler antennas 300 located on the connecting portions 932 are uniform entirely in the width direction of the communication device 240.

While the illustrated front unit 910 has a configuration including the two front slide frames 911 and 911 separated from each other in the front-back direction, the front unit 910 may have a configuration including one front slide frame 911, or three or more front slide frames 911.

<Rear Unit>

Referring back to FIG. 17, the rear unit 920 includes a plurality of rear slide frames 921 and 921 that each include the guide rail 930B and that are arranged away from each other in the width direction, the coupler antennas 300 attached to the rear slide frames 921 and 921, and cable guides 925, 925, . . . supporting cables connected to the coupler antennas 300.

The coupler antennas 300, 300, . . . attached to each of the rear slide frames 921 and 921 constitute a rear coupler antenna array.

Figure 19:
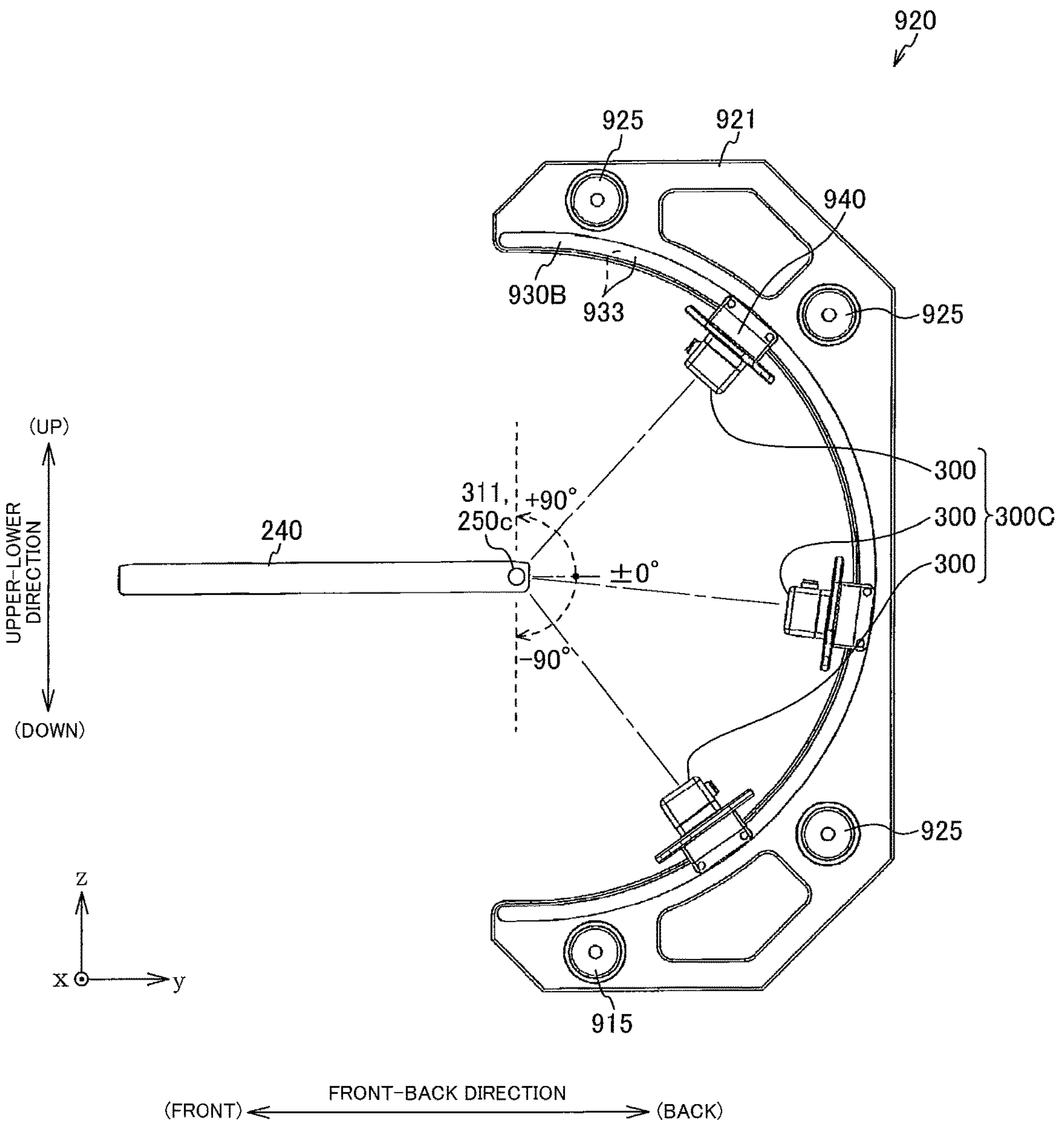
FIG. 19 is a side view of a rear slide frame.

FIG. 19 is a side view of the rear slide frame. FIG. 19 illustrates the rear slide frame 921 observed from the other end side in the width direction.

The rear slide frames 921 have a substantially C or U shape in a side view. The rear slide frames 921 and 921 are arranged at predetermined locations in the width direction in the test space S.

The cable guides 925 are members in a round bar shape extending in the width direction. The cable guides 925 are inserted into through holes formed at appropriate places in the plane of the rear slide frames 921. The cable guides 925 position and fix the rear slide frames 921 and 921 at predetermined locations in the longitudinal direction of the cable guides 925.

Both end portions in the width direction of each of the cable guides 925 are fixed to the side surface of the housing body 101. The cable guides 925 function as fixing means for fixing the rear slide frames 921 to the housing body 101 and positioning and fixing the rear slide frames 921 at the predetermined locations in the width direction in the test space S. The cable guides 925, 925, . . . also function as distance maintaining members that maintain a predetermined distance between the both rear slide frames 921 and 921.

The arc-like guide rails 930B are formed on a front part side of the rear slide frames 921, that is, a side facing the communication device 240. Each of the guide rails 930B illustrated in the present example is configured to include a pair of guide grooves 933 formed on both side surfaces in the width direction of the rear slide frames 921.

Each of the guide rails 930B is arranged at least in a row in the upper-lower direction along the rear surface S5. The guide rails 930B are arranged along the upper surface S3, the rear surface S5, and the lower surface S4 of the test space S. That is, the coupler antennas 300 supported by the associated guide rail 930B to be movable back and forth constitute the rear coupler antenna array.

In the test space S, the arrangement is made in such a manner that the locations in the width direction of the communication antennas 250*c* mounted on the communication device 240 in the test space S match the locations in the width direction of the rear slide frames 921 in the test space S.

The coupler antennas 300, 300, . . . arranged at certain locations on each of the guide rails 930B form the coupler antenna array 300C (a coupler antenna group) placed in a row on an arc around the associated communication antenna 250*c*. The coupler antenna array 300C is configured to include at least three coupler antennas 300. The distances between the coupler antennas 300 and the associated communication antenna 250*c* are equal. The coupler antennas 300, 300, . . . constituting the coupler antenna array 300C form the beam spot 311 on the associated communication antenna 250*c*.

Each of the guide rails 930B moves the coupler antennas 300 back and forth along the circumferential direction around the corresponding communication antenna 250*c*. The guide rails 930B arrange the coupler antennas 300 in desired angular directions (elevation angles) with respect to the corresponding communication antennas 250*c*, respectively. The guide rails 930B illustrated in the present example move the coupler antennas 300 in a range of an elevation angle from −90 degrees to +90 degrees.

While the illustrated rear unit 920 has a configuration including the two rear slide frames 921 and 921 arranged apart from each other in the width direction, the rear unit 920 may have a configuration including one rear slide frame 921, or three or more rear slide frames 921.

<Attachment of Coupler Antennas to Guide Rail>

Figure 20:
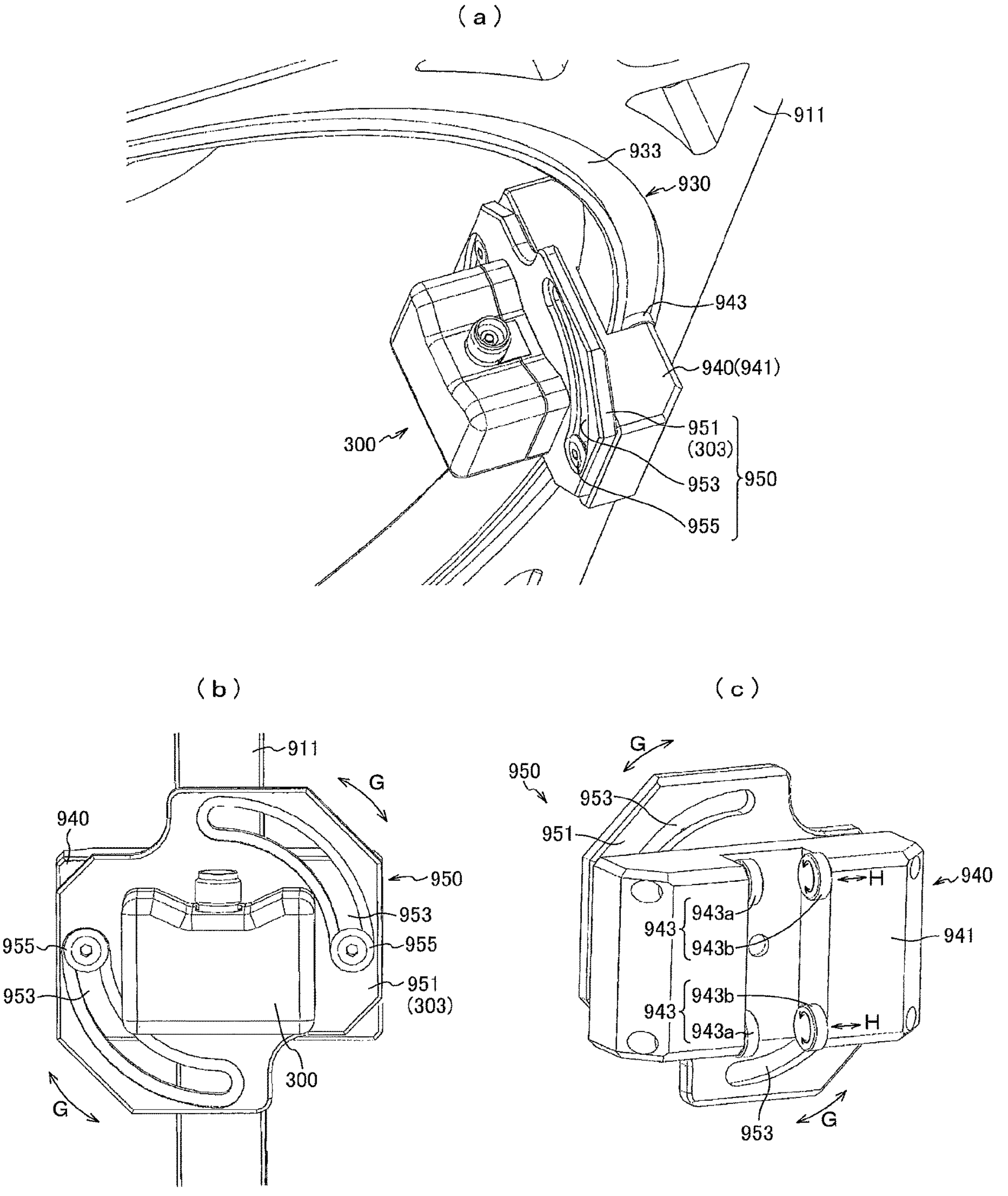
FIG. 20 are diagrams for explaining a method for attaching the coupler antennas to guide rails.

FIG. 20 are diagrams for explaining a method for attaching the coupler antennas to the guide rails. FIG. 20(*a*) is a perspective view of the guide rail and a coupler antenna supported by the guide rail, which are observed from the front side, FIG. 20(*b*) is a front view thereof, and FIG. 20(*c*) is a perspective view of a coupler slider having the coupler antenna mounted thereon, which is observed from the back side. While an example in a case in which the coupler antennas 300 are attached to the front slide frame 911 is explained below, the same holds for a case in which the coupler antennas 300 are attached to the rear slide frame 921.

The coupler unit 900 includes the guide rails 930, coupler sliders 940 that slide along the guide rails 930, and the coupler antennas 300 attached to the coupler sliders 940. The coupler antennas 300 are attached to the front slide frames 911 via the coupler sliders 940.

One coupler antenna 300 is fitted to one coupler slider 940. The coupler unit 900 moves the coupler antennas 300 individually (independently) back and forth along the guide rails 930.

The following explanations are given assuming a side of the coupler sliders 940 facing the communication device 240 as a front side and a side opposite thereto as a back side.

As illustrated in FIG. 20(*c*), each of the coupler sliders 940 includes a slider base 941, and guide roller pairs 943 and 943 running in the guide grooves 933 and 933 on the back side of the slider base 941. Each of the guide roller pairs 943 is configured to include two guide rollers 943*a* and 943*b* arranged to face in the thickness direction of the front slide frame 911. Both the guide rollers 943*a* and 943*b* are pivotally supported by the slider base 941 to be rotatable in the forward-reverse direction. Each of the guide roller pairs 943 sandwiches the front slide frame 911 in the thickness direction (the front-back direction) in the guide grooves 933 and 933.

At least one (the guide roller 943*b*) of the guide rollers constituting each of the guide roller pairs 943 is configured to be movable back and forth in the thickness direction of the front slide frame 911 (directions of an arrow H in the drawing) due to a screw or the like embedded in the slider base 941. The distance between the guide rollers 943*a* and 943*b* and the pressing force (frictional force) of the guide roller pairs 943 against the front slide frame 911 are configured to be adjustable with the screw or the like.

When the pressing force of the guide roller pairs 943 on the front slide frame 911 is smaller than a predetermined value, the coupler slider 940 moves back and forth along the guide rail 930. When the pressing force of the guide roller pairs 943 on the front slide frame 911 is larger than the predetermined value, the coupler slider 940 is fixed to the front slide frame 911 and stops on the guide rail 930.

The coupler sliders 940 are freely removed from the guide rail 930, for example, by detaching one of the guide rollers constituting each of the guide roller pairs 943 from the slider base 941. Alternatively, the coupler sliders 940 are freely removed from the guide rail 930, for example, through a slider removal portion provided at an appropriate place on the guide rail 930.

<Coupler Rotating Mechanism>

Each of the coupler antennas 300 is attached to the front side of the coupler slider 940 via a coupler rotating mechanism 950 that relatively rotates the coupler antenna 300 with respect to the coupler slider 940.

The coupler rotating mechanism 950 illustrated in the present example is a first coupler rotating mechanism that rotates the coupler antenna 300 forward and reversely in directions of an arrow G in the drawing around the antenna beam 310 (see FIG. 6). The coupler rotating mechanism 950 is configured to include arc-like elongate holes 953 formed on a rotation base 951, and screws 955 screwed to the coupler slider 940 through the elongate holes 953. The coupler rotating mechanism 950 displaces the coupler antenna 300 on the coupler slider 940 to either a vertically polarized attitude or a horizontally polarized attitude.

The rotation base 951 in the present example is a member corresponding to the attachment base 303 of the coupler antenna 300.

With provision of the coupler rotating mechanism 950 in the coupler unit 900, the coupler antenna 300 is supported at any location on the guide rail 930 in a vertically polarized attitude or a horizontally polarized attitude.

<Effects>

At the development stage of the communication device 240, characteristic tests are sometimes performed on various communication devices 240 where the sizes thereof and the locations of the communication antennas 250 are different from each other. Therefore, it is desirable that arrangement of the coupler antennas 300 in the test space S can be flexibly changed.

According to the present embodiment, the locations of the coupler antennas 300 with respect to the communication device 240 can be continuously changed on the guide rail 930, and therefore the coupler antennas 300 can be arranged according to the locations of the communication antennas 250 mounted on the communication device 240. Accordingly, various characteristic tests can be performed on various communication devices 240 where the sizes thereof and the locations of the communication antennas 250 are different from each other.

The guide rails 930 (the curved portions 931 and the guide rails 930B) in the present embodiment move the coupler antennas 300 back and forth along the arcs around the communication antennas 250. Therefore, the elevation angles of the coupler antennas 300 with respect to the associated communication antenna 250 can be set to any angle while the distances between the communication antenna 250 and the coupler antennas 300 are maintained uniform. Since the distances between the communication antenna 250 and the coupler antennas 300 are uniform regardless of the elevation angles of the coupler antennas 300 with respect to the communication antenna 250, the loss at the time of propagation of emitted radio waves in the space can be uniformized and calculation related to the characteristic test on the communication antenna 250 at a certain elevation angle can be easily performed.

The present embodiment includes the coupler rotating mechanism 950 that displaces each of the coupler antennas 300 to either a vertically polarized attitude or a horizontally polarized attitude. According to the present embodiment, the attitude of each of the coupler antennas 300 can be easily changed to any attitude. Even when the coupler antennas handle linearly polarized waves in one direction, various characteristic tests can be performed by switching between the horizontally polarized waves and the vertically polarized waves. Furthermore, a test of simultaneously transmitting and receiving radio waves of horizontally polarized waves and vertically polarized waves in one direction can be performed by arranging two coupler antennas closely to each other and adapting one of the coupler antennas to the horizontally polarized waves while adapting the other to the vertically polarized waves. Accordingly, the MIMO test or the handover test with different polarized waves in certain directions can be also performed.

In a communication device having a beam forming function, radio waves are emitted only in a direction required for communication. In a case in which the coupler antennas are fixed to certain locations on the testing device, radio waves emitted from the communication antenna do not always reach the coupler antennas due to the size of the communication device or restrictions on the configuration of the communication device, which leads to a risk that accurate measurement cannot performed.

In the present embodiment, the coupler antennas can be arranged circularly around a communication device. Therefore, the coupler antennas can be fixed to locations according to the direction of radio waves emitted from the communication device, which enables the radio waves emitted from the communication device to be reliably caught, and more accurate measurement to be performed. According to the present embodiment, the coupler antennas can be fixed to any location around the communication device. Therefore, for various communication devices 240 in which the sizes thereof and the locations of the communication antennas 250 are different from each other, a test in which radio waves emitted from the communication antennas 250 are reliably caught can be conducted with one testing device.

Fifth Embodiment

Figure 21:
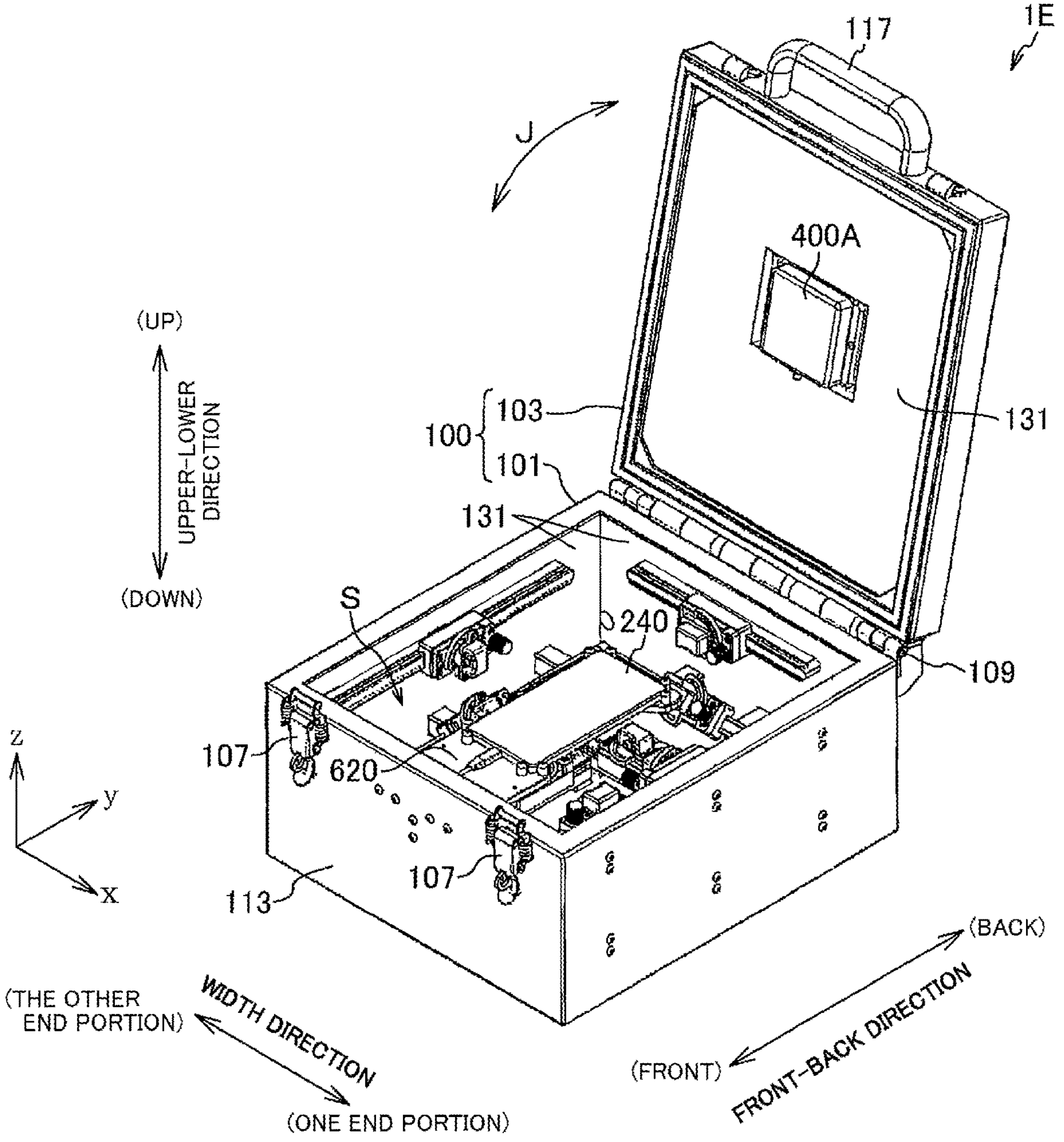
FIG. 21 is a perspective view illustrating a testing device according to a fifth embodiment of the present invention.

FIG. 21 is a perspective view illustrating a testing device according to a fifth embodiment of the present invention.

The testing device according to the present embodiment is characterized in including a guide rail that supports coupler antennas slidably in the front-back direction along the side surfaces of the housing, and a guide rail that supports coupler antennas slidably in the width direction along the rear surface of the housing.

In the following descriptions, members identical to those of the first to fourth embodiments are denoted by like reference signs and explanations thereof are omitted as appropriate.

<Housing>

In a testing device 1E, the housing 100 includes the housing body 101 in a substantially cuboid shape open on the upper surface (one face), and the upper cover 103 that freely opens and closes the upper surface opening of the housing body 101. The upper cover 103 is supported by a hinge portion 109 provided on a rear end upper part of the housing body 101 to be pivotable with respect to the housing body 101 in directions of an arrow J in the drawing. The upper cover 103 closing the upper surface opening of the housing body 101 is maintained in a closed state by clasps 107 provided in an upper part on the front end of the housing body 101. A grip 117 that operates the upper cover 103 to open or close is attached at an appropriate place of the upper cover 103 spaced apart from the hinge portion 109.

A plurality of coaxial connectors and a plurality of USB connectors are provided on the back surface of the housing 100 illustrated in FIG. 21, similarly to the housing 100 illustrated in FIG. 1.

The radio wave absorbers 131 that absorb radio waves of predetermined frequencies are attached to six internal surfaces of the housing 100 illustrated in FIG. 21.

<Tray Body>

Figure 22:
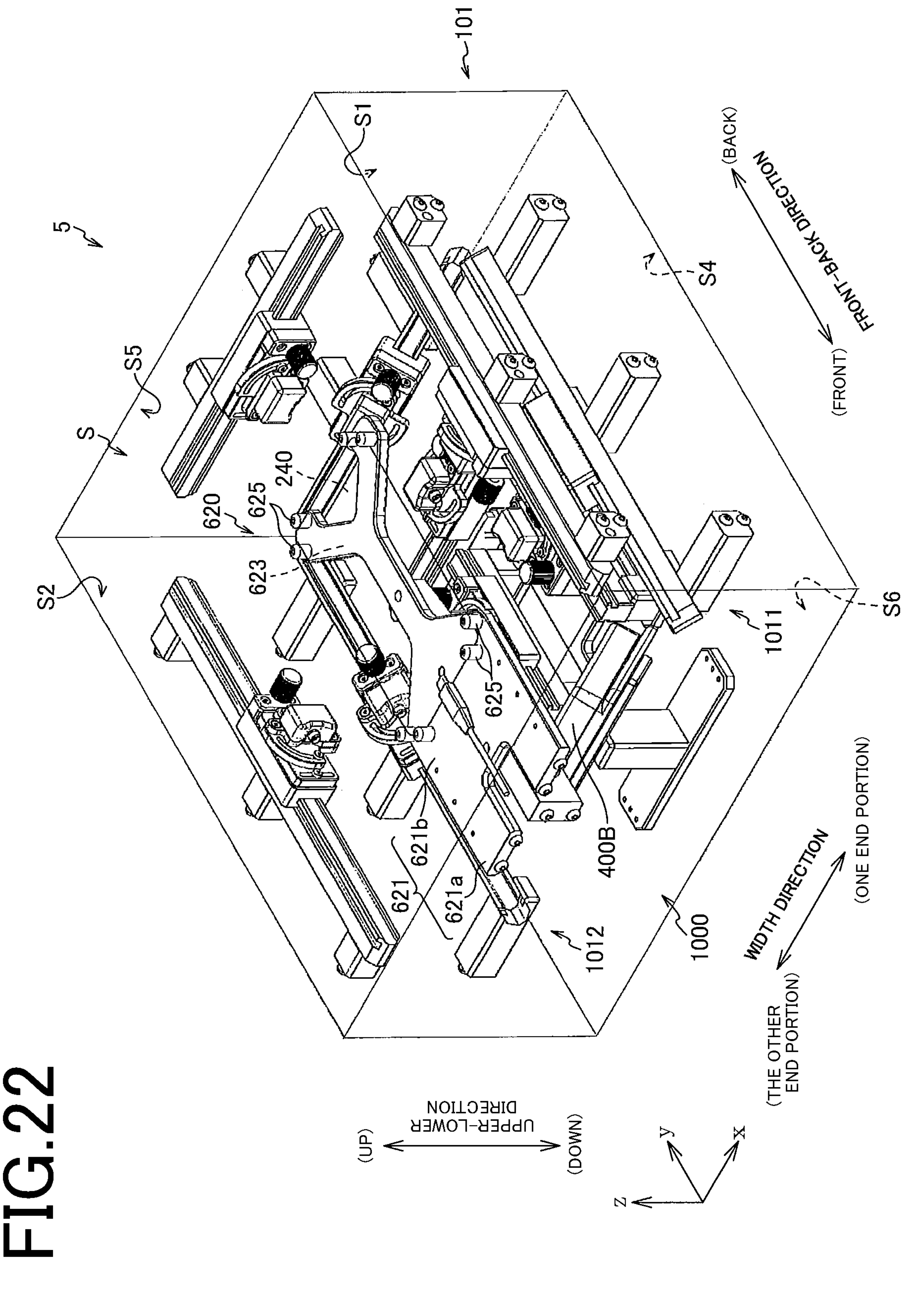
FIG. 22 is a transparent perspective view illustrating an internal configuration of the testing device.

FIG. 22 is a transparent perspective view illustrating an internal configuration of a testing device. The tray body 620 that supports the communication device 240 is placed in the test space S. The tray body 620 in the present embodiment is different from the tray body 620 illustrated in FIG. 13 in that the front end portion 621*a* is fixed to the front panel 113 of the housing body 101. However, the basic configuration of the tray body 620 in the present embodiment is identical to that of the tray body 620 illustrated in FIG. 13 and thus detailed explanations thereof are omitted.

<Coupler Unit>

A coupler unit 1000 (a coupler support unit) that arranges the coupler antennas 300 at predetermined locations with respect to the communication device 240 in the test space S is explained.

The coupler unit 1000 includes a right side unit (a first side unit) 1011 placed on one end side in the width direction of the communication device 240, a left side unit (a second side unit) 1012 placed on the other end side in the width direction of the communication device 240, and a rear unit 1013 placed on a rear end side of the communication device 240.

The right side unit 1011 supports the coupler antennas 300 in such a manner that the coupler antennas 300 form the beam spot 311 on the associated communication antenna 250*a* located in one end portion (a right end portion) in the width direction of the communication device 240.

The left side unit 1012 supports the coupler antennas 300 in such a manner that the coupler antennas 300 form the beam spot 311 on the associated communication antenna 250*b* located in the other end portion (a left end portion) in the width direction of the communication device 240.

The rear unit 1013 supports the coupler antennas 300 in such a manner that the coupler antennas 300 form the beam spot 311 on the associated communication antenna 250*c* located in a rear end portion of the communication device 240.

<Side Unit Rear Unit>

Figure 23:
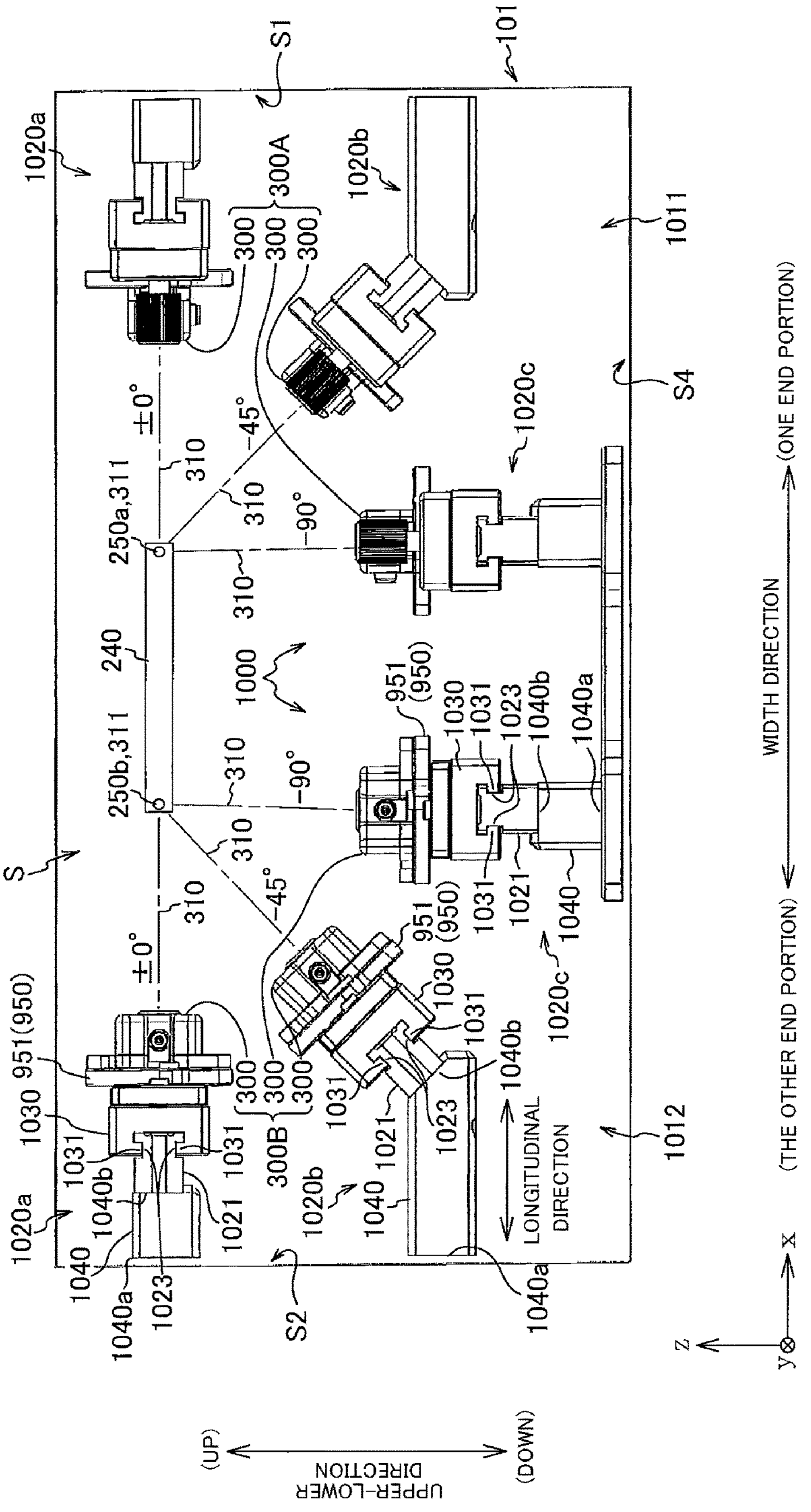
FIG. 23 is a front view illustrating a location relation between left and right side units and the communication device.
Figure 24:
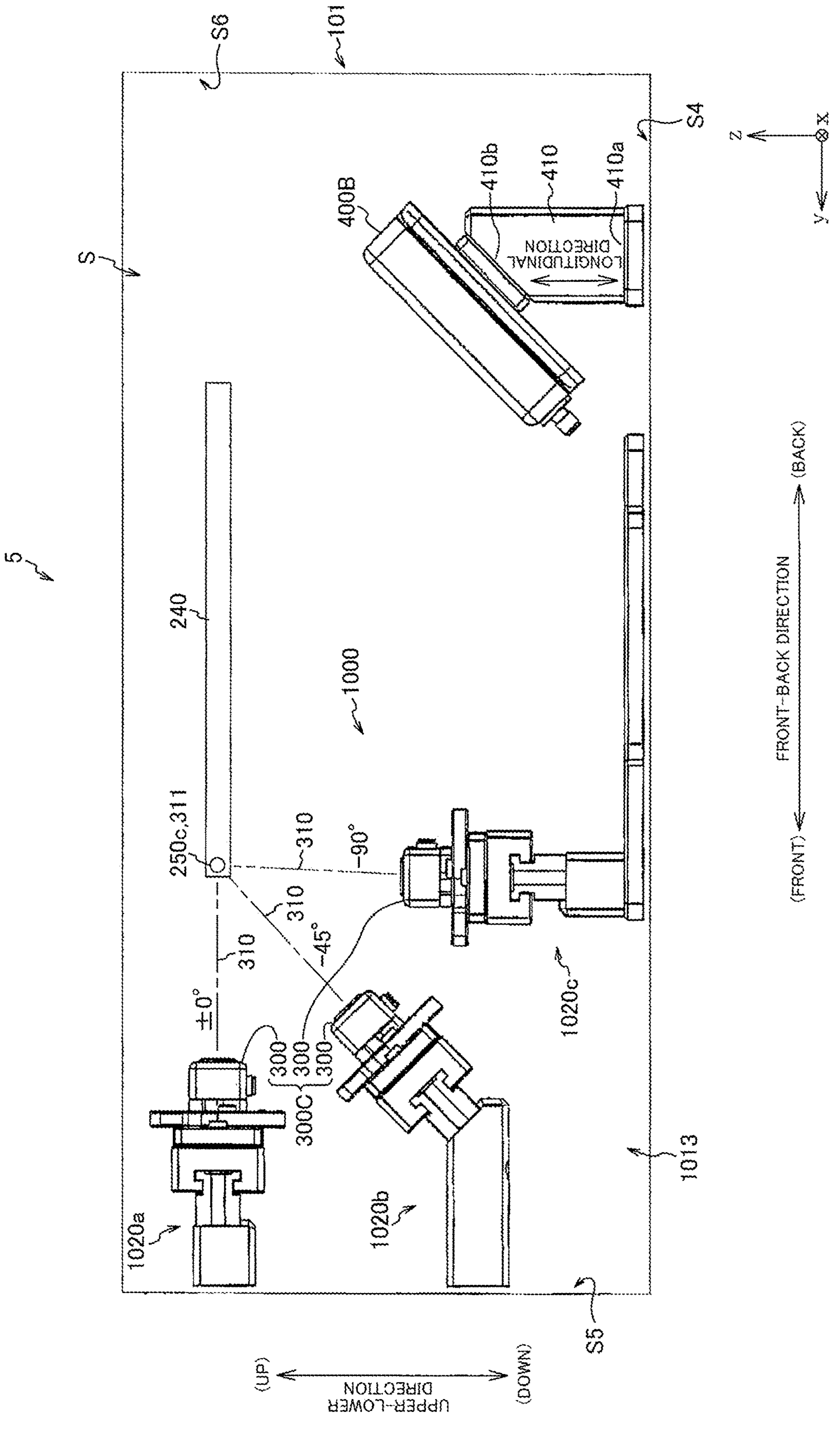
FIG. 24 is a side view illustrating a location relation between a rear unit and the communication device.

FIG. 23 is a front view illustrating a location relation between the left and right side units and the communication device. FIG. 24 is a side view illustrating a location relation between the rear unit and the communication device.

The right side unit 1011, the left side unit 1012, and the rear unit 1013 are configured to respectively include a plurality of subunits 1020 (subunits 1020*a* to 1020*c*). The subunits 1020 are fixed to the housing body 101. The subunits 1020 support the coupler antennas 300 to cause the antenna beams 310 of the coupler antennas 300 to point the associated communication antennas 250 from predetermined locations and at predetermined elevation angles.

For example, the subunits 1020*a*, the subunits 1020*b*, and the subunits 1020*c* support the associated coupler antennas 300 to cause the antenna beams 310 of the coupler antennas 300 to point the associated communication antennas 250 at the elevation angles of 0 degree, −45 degrees, and −90 degrees, respectively.

In the present embodiment, no coupler antennas 300 are arranged above the communication device 240. This is in consideration of a case in which radio waves of 24 GHz to 43.5 GHz are not emitted from the side of a display surface provided on the upper surface of the communication device 240 due to blockage by the display. In the present embodiment, only one NFC antenna unit 400 is placed just above the communication device 240 to reduce the height of the housing 100 and downsize the testing device.

The elevation angles of the antenna beams 310 of the coupler antennas 300 may be angles other than those described above.

The right side unit 1011 can arrange a plurality of coupler antennas 300 in a row at predetermined locations in the front-back direction along the side surface S1 and the lower surface S4 of the test space S. The left side unit 1012 can arrange a plurality of coupler antennas 300 in a row at predetermined locations in the front-back direction along the side surface S2 and the lower surface S4 of the test space S. The coupler antennas 300 supported by each of the side units 1011 and 1012 can form the coupler antenna array 300A or 300B (a side coupler antenna array, a coupler antenna group) arranged in a row in the upper-lower direction along the side surface (S1 or S2) and the lower surface S4.

The rear unit 1013 can arrange a plurality of coupler antennas 300 in a row at predetermined locations in the width direction along the rear surface S5 and the lower surface S4 of the test space S. The coupler antennas 300 supported by the rear unit 1013 can form the coupler antenna array 300C (a rear coupler antenna array, a coupler antenna group) arranged in a row in the upper-lower direction along the rear surface S5 and the lower surface S4.

<Subunits>

Figure 25:
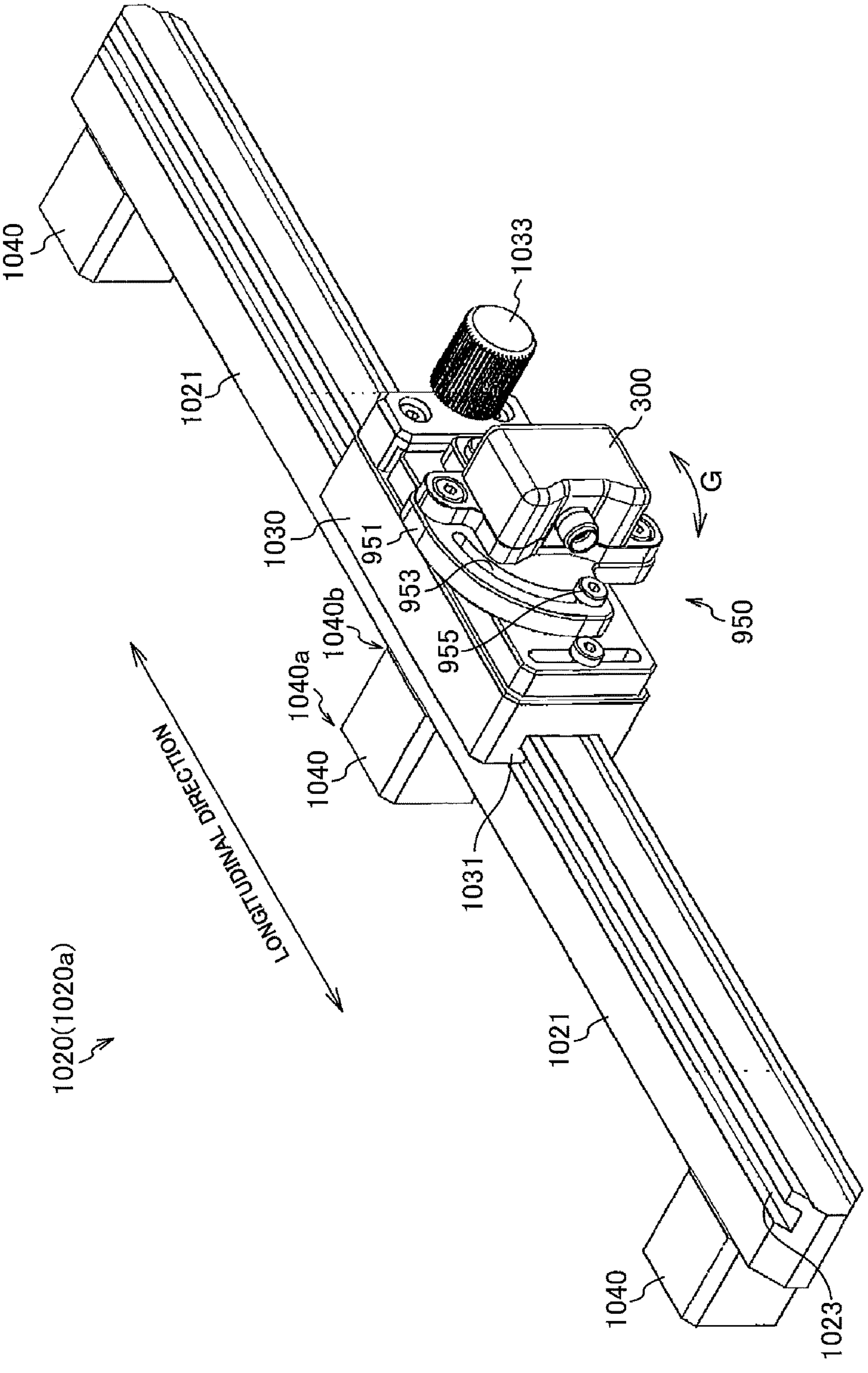
FIG. 25 is a perspective view illustrating an example of a subunit.

FIG. 25 is a perspective view illustrating an example of the subunit. The subunit 1020*a* (for the elevation angle of 0 degree) is illustrated in FIG. 25.

The subunits 1020 each include a guide rail 1021 extending along the associated surface of the test space S, a coupler slider 1030 that is supported by the guide rail 1021 to be movable back and forth, the coupler antenna 300 mounted on the coupler slider 103, and a housing attachment piece 1040 that fixes the guide rail 1021 to the housing body 101.

The guide rail 1021 includes a pair of guide grooves 1023 and 1023 formed on the both side portions. The guide grooves 1023 are formed linearly along the longitudinal direction of the guide rail 1021. The guide grooves 1023 enable the coupler slider 1030 to linearly reciprocate.

The coupler slider 1030 includes clicks 1031 and 1031 engaging with the guide grooves 1023 and 1023 formed on the guide rail 1021 and running in the guide grooves 1023 and 1023, and a fixing screw 1033 having a leading end portion moving back and forth with respect to the surface of the guide rail 1021. The fixing screw 1033 fixes the coupler slider 1030 to the guide rail 1021 when the leading end face is pressed against the guide rail 1021, and enables the coupler slider 1030 to slide along the guide rail 1021 when the leading end face is separated from the guide rail 1021. The coupler slider 1030 is freely removed from the guide rail 1021 from any of end portions in the longitudinal direction of the guide rail 1021.

The coupler antenna 300 is attached to the coupler slider 1030 via the coupler rotating mechanism 950 that relatively rotates the coupler antenna 300 with respect to the coupler slider 1030. The coupler rotating mechanism 950 illustrated in the present example is the first coupler rotating mechanism that rotates the coupler antenna 300 around the antenna beam 310 (see FIG. 6). A detailed configuration of the coupler rotating mechanism 950 is as illustrated in FIG. 2 and thus detailed explanations thereof are omitted.

One coupler antenna 300 is fitted to one coupler slider 1030. The coupler unit 1000 moves the coupler antennas 300 individually (independently) back and forth along the guide rails 1021.

The housing attachment piece 1040 is a means for fixing the guide rail 1021 to the housing body 101. The housing attachment piece 1040 supports the coupler antenna 300 via the guide rail 1021 and the coupler slider 1030.

As illustrated in FIG. 23, each of the housing attachment pieces 1040 has one portion 1040*a* (one end in the longitudinal direction) fixed to the housing body 101 and directly supports the guide rail 1021 on a fitting face 1040*b* formed at the other portion (the other end portion in the longitudinal direction).

The angle of the fitting face 1040*b* with respect to the longitudinal direction of the housing attachment piece 1040 is set to an angle corresponding to the elevation angle of the coupler antenna 300 indirectly supported by the housing attachment piece 1040. For example, the fitting face 1040*b* of the housing attachment piece 1040 constituting the subunit 1020*b* is tilted at 45 degrees with respect to the longitudinal direction of the housing attachment piece 1040. The housing attachment piece 1040 determines the elevation angle of the coupler antenna 300 with respect to the communication antenna 250.

The housing attachment piece 1040 also determines the distance between the communication antenna 250 and the associated coupler antenna 300. That is, the longitudinal length of the housing attachment piece 1040 is set so as to enable the coupler antennas 300, 300, . . . mounted on one set of the subunits 1020*a* to 1020*c* to form a coupler antenna array in which the coupler antennas are at an equal distance from the communication antenna 250. For example, in the set of the subunits 1020*a* to 1020*c* constituting the left side unit 1012, the coupler antennas 300, 300, . . . arranged at the same location in the front-back direction as that of the communication antenna 250*b* facing the left side unit 1012 form the coupler antenna array 300B in which the coupler antennas are arranged at an equal distance from the communication antenna 250*b*.

The distance between the coupler antennas 300, 300, . . . and the communication antenna 250 is set to, for example, 50 millimeters. With arrangement of the coupler antennas 300 to set the distance from the communication antenna 250 to be equal to or less than 50 millimeters, favorable communication can be realized between the communication antenna 250 and the coupler antennas 300 and the testing device 1E can be downsized while the space loss is suppressed.

<Arrangement of NFC Antennas>

The testing device 1E may optionally include the NFC antenna units 400 (400A and 400B) in the test space S. The testing device 1E illustrated in the present example includes the NFC antenna unit 400A installed at an appropriate place of the upper cover 103 facing the test space S, and the NFC antenna unit 400B installed in a front lower part in the test space S.

The NFC antenna unit 400A is located just above the communication device 240 when the upper cover 103 is closed.

The NFC antenna unit 400B is supported by a housing attachment piece 410 fixed on the bottom surface of the housing body 101. The housing attachment piece 410 has one portion 410*a* (one end in the longitudinal direction) fixed to the bottom surface of the housing body 101, and supports the NFC antenna unit 400B on an attachment face 410*b* formed on the other portion (the other end portion in the longitudinal direction). The angle of the attachment face 410*b* is set to cause the NFC antenna unit 400B to face the communication device 240 at a predetermined elevation angle.

<Effects>

At the development stage of the communication device 240, characteristic tests are sometimes performed on various communication devices 240 where the sizes thereof and the locations of the communication antennas 250 are different from each other. Therefore, it is desirable that the arrangement of the coupler antennas 300 in the test space S can be flexibly changed.

According to the present embodiment, the location of the coupler antenna 300 with respect to the communication device 240 can be continuously changed on the guide rail 1021 and therefore the coupler antennas 300 can be arranged according to the locations of the communication antennas 250 mounted on the communication device 240. Accordingly, various characteristic tests can be performed on various communication devices 240 where the sizes thereof and the locations of the communication antennas 250 are different from each other.

Since the coupler antennas 300 are arranged at locations from an identical height location to that of the communication device 240 to lower locations in the present embodiment, the height of the housing 100 can be lowered relative to the housings 100 described in the first to fourth embodiments.

While the configuration in which the communication device 240 is supported by the tray body 620 having the front end portion 621*a* fixed to the front panel 113 has been described in the present embodiment, a configuration in which the communication device 240 is supported with a tray unit that can be ejected from or retracted into the housing body 101 in the manner of a drawer as illustrated in FIG. 13 may be adopted.

The testing device 1E according to the present embodiment includes the guide rails 1021 that linearly guide the coupler antennas 300 in directions intersecting with the corresponding coupler antenna array, particularly in the horizontal direction along the side surface (the both side surfaces in the width direction and the rear surface) of the housing body 101 in the present example. Since the configuration of the guide rails 1021 can be simplified according to the present aspect, the testing device 1E can be downsized.

The coupler antennas 300 supported by the guide rails 1021 reciprocate along the end edges (the end edges in the width direction and the rear end edge) of the communication device 240. Therefore, the locations of the coupler antennas 300 can be adjusted according to the locations in the width direction or the locations in the front-back direction of the communication antennas 250.

A set of coupler antennas 300, 300, . . . mounted on the grouped subunits 1020*a* to 1020*c* are arranged in a row on an arc around the associated communication antenna to form a coupler antenna array (a coupler antenna group) when arranged at locations in the front-back direction or locations in the width direction identical to that of the communication antenna 250. Since the elevation angle is fixedly set for each of the guide rails in the present embodiment, adjustment of the elevation angles of the coupler antenna 300 is not required. Further, the configuration of the guide rails 1021 can be simplified and thus the testing device 1E can be downsized.

The testing device according to the present example includes an NFC antenna unit that supports a sub-6 GHz band, and a plurality of coupler antennas that support 24 GHz to 43.5 GHz. That is, the testing device according to the present example covers the frequencies from 60 MHz to 43.5 GHz allocated to 5G, and can perform tests corresponding to the frequencies. Furthermore, with attachment of a coupler antenna that supports a different frequency band higher than the frequency band described above (for example, higher than 60 GHz), communication tests in the different frequency band are enabled.

A plurality of coupler antennas can be arranged at any location in the longitudinal direction on each of the guide rails to which the coupler antennas are fitted. Therefore, the beam forming test and the handover test can be performed using the coupler antennas arranged at different locations on a same guide rail. Furthermore, the MIMO test can be performed by a combination of plural coupler antennas.

As described above, various characteristic tests (the power measurement, the EVM measurement, the spurious measurement, the MIMO test, the beam forming test, the handover test, and the protocol test) required for evaluation of a communication device compatible with 5G can be performed with only one testing device illustrated in the present embodiment. In the present embodiment, the testing device can be downsized due to arrangement of the coupler antennas in a near field range of radio waves transmitted and received by the communication antennas 250 (at a distance of 50 millimeters from the communication device in the present example).

While the guide rails 1021 are fixed to the housing body 101 via the housing attachment pieces 1040 in the present example, each of the subunits 1020 may include a guide unit that brings the guide rail 1021 close to or away from the communication device 240 while keeping the location of the guide rail 1021 in the height direction in the test space S. The guide unit moves the guide rail 1021 away from or close to the internal surface of the housing 101 that supports the guide rail 1021. In this case, the guide unit moves the guide rail 1021 while maintaining the elevation angles of the coupler antennas 300 (the orientations of the coupler antennas 300) constant.

In a case in which the testing device includes the guide unit described above, the locations of the coupler antennas 300 with respect to the communication device 240 can be adjusted according to the size of the communication device 240.

[Another Example of Coupler Rotating Mechanism]

Figure 26:
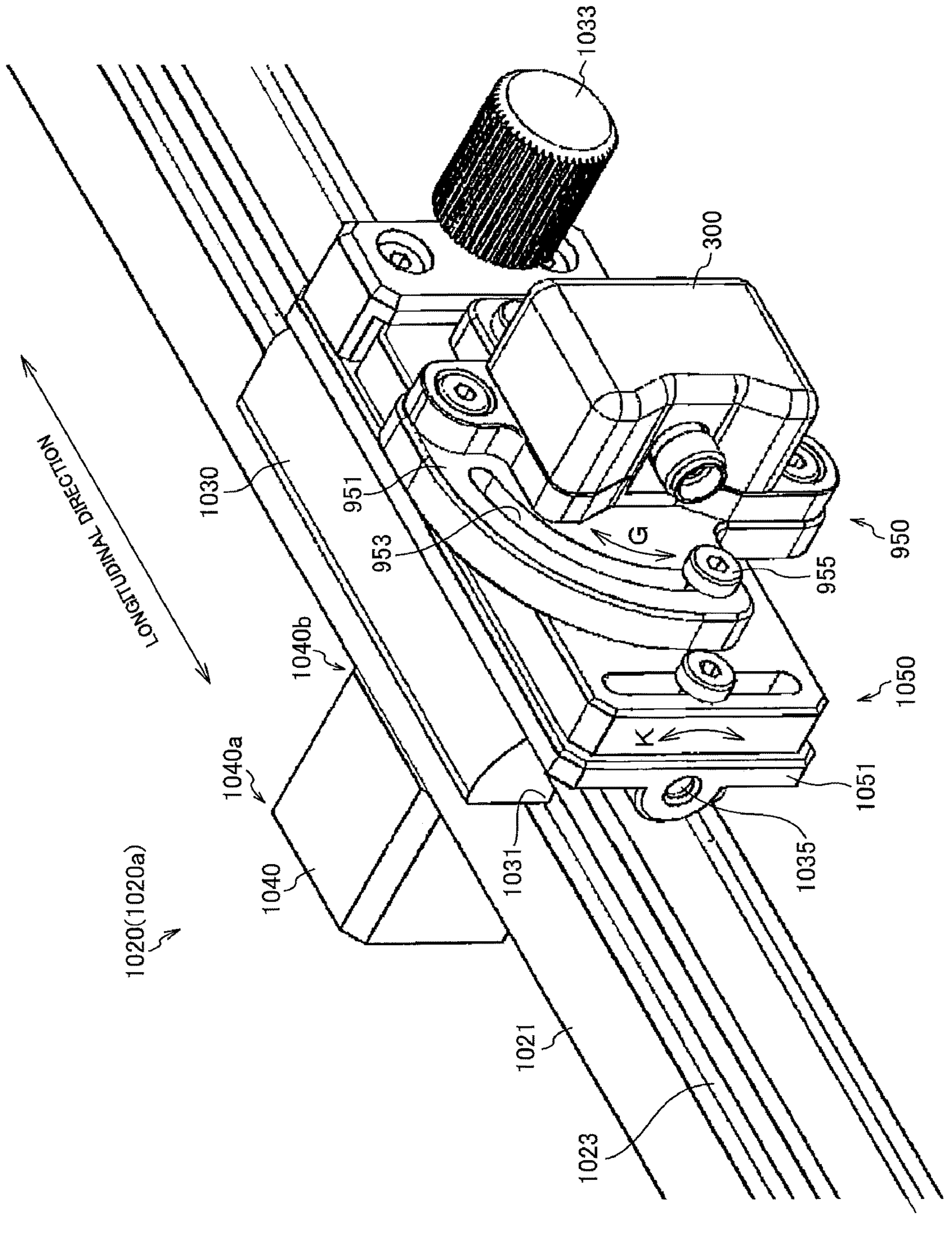
FIG. 26 is a partially enlarged perspective view illustrating another example of the subunit.

FIG. 26 is a perspective view illustrating another example of the subunit.

Each of the coupler antennas 300 may be attached to the coupler slider 1030 via a coupler rotating mechanism 1050 (a second coupler rotating mechanism) that adjusts the elevation angle of the antenna beam 310 (see FIG. 6) in addition to the coupler rotating mechanism 950 (the first coupler rotating mechanism).

The coupler rotating mechanism 1050 includes a rotation base 1051 that is pivotally supported by a pivotally support portion 1035 provided on the coupler slider 1030 to be rotatable in the forward-reverse direction. The axis line of the pivotally support portion 1035 extends along the longitudinal direction of the guide rail 1021 and the rotation base 1051 rotates in the forward-reverse direction in directions of an arrow K with respect to the coupler slider 1030.

With provision of the coupler rotating mechanism 1050, the elevation angles of the coupler antennas 300 with respect to the communication antenna can be finely adjusted.

The coupler antennas 300 may be attached to the coupler slider 1030 via a coupler rotating mechanism (a third coupler rotating mechanism) that adjusts the azimuth of the antenna beam 310. The third coupler rotating mechanism is illustrated as a configuration of the second coupler rotating mechanism rotated by 90 degrees on the axis line along the antenna beam 310.

The coupler antennas 300 may be attached to the coupler slider 1030 via all or some of the first to third coupler rotating mechanisms.

[Modification]

In the embodiments described above, the tray body has a configuration to fixedly support the communication device 240 in the test space S with the display face of the communication device 240 being the upper surface. However, the tray body may support the communication device 240 with the display face being the lower surface or may support the communication device 240 in an erecting attitude.

In the first, second, fourth, and fifth embodiments, the coupler antennas 300 are arranged in the upper-lower direction with respect to each of the communication antennas 250. However, the coupler antennas 300 may be arranged in other arrays. For example, the coupler antennas 300 may be arranged at predetermined azimuths in the horizontal direction on a circumference around the associated communication antenna 250, or may be arranged on a spherical face around the communication antenna 250.

In the embodiments described above, the coupler antennas 300 constituting one coupler antenna group are placed on an arc or a spherical face around the associated communication antenna 250. However, arrangement of the coupler antennas 300 is not limited thereto. It suffices that each of the coupler antennas 300 is placed at a location where radio waves emitted from the associated communication antenna 250 can reach the coupler antenna 300. In a specific example, it suffices that each of the coupler antennas constituting one coupler antenna group is supported by a coupler support unit to enable the antenna beams of the coupler antennas to focus on the associated communication antenna 250.

Each of the configurations described in the above embodiments may be appropriately combined and implemented unless being contradictory to one another.

[Summary of Examples of Aspects of the Present Invention, and Operations and Effects]

<First Aspect>

The present aspect is the testing device 1 for a communication device, that performs characteristic tests on a test target antenna (a communication antenna 250) for a microwave band or a milliwave band included in a communication device 240 in a near field, and includes an anechoic box (a housing 100, a panel portion 210 of a tray unit 200, and radio wave absorbers 131 and 211) that forms a test space S as an anechoic chamber, a communication device support unit (a tray body 220) that supports the communication device in the test space, and a coupler support unit (a coupler support frame 520) that supports a plurality of coupler antennas 300 receiving radio waves emitted from the test target antenna or transmitting radio waves to the test target antenna.

The coupler support unit is configured to be capable of forming an inner-periphery coupler antenna array (a coupler antenna array 300A or 300B) including a plurality of inner-periphery coupler antennas (the coupler antennas 300) arranged at least in a row along a curve extending along an inner peripheral surface composed of opposing two side surfaces S1 and S2, an upper surface S3, and a lower surface S4 of the anechoic box, and a rear coupler antenna array (a coupler antenna array 300C) including rear coupler antennas (the coupler antennas 300) arranged at least in a row in an upper-lower direction along a curve extending along a rear surface S5 that intersects with a circumferential direction of the inner peripheral surface.

According to the present aspect, characteristic tests on the test target antenna are performed in a near field range, so that the testing device can be downsized. Since the communication device and the coupler antennas can be fixedly arranged, the testing device can have a simple configuration. Furthermore, a communication device in a fifth generation communication system includes a plurality of communication antennas and antenna beams emitted from the communication device can be pointed to a certain direction by adjusting the phases of the communication antennas. Since a plurality of coupler antennas can be arranged to surround the communication device in the test space in the present aspect, reception levels of the coupler antennas in a case in which the antenna beams are pointed to certain coupler antennas can be obtained without moving the communication device and the coupler antennas.

<Second and Third Aspects>

In the testing device 1 according to a second aspect, the coupler support unit (the coupler support frame 520) is configured to be capable of arranging plural rows of the inner-periphery coupler antenna arrays (300A1 to 300A3 or 300B1 to 300B3) along a front-back direction of the anechoic box (the test space S).

In the testing device 1 according to a third aspect, the coupler support unit (the coupler support frame 520) is configured to be capable of arranging plural rows of the rear coupler antenna arrays (300C1 to 300C3) along a width direction of the anechoic box (the test space S).

When there are a plurality of communication antennas, the coupler antenna arrays can be associated with the communication antennas, respectively. Alternatively, a plurality of coupler antenna arrays can be associated with one communication antenna. According to the present aspects, the flexibility of the characteristic tests can be increased.

<Fourth Aspect>

In the testing device 1 according to the present aspect, each of the coupler antennas 300 is selectively attachable and detachable to/from the coupler support unit (a coupler attachment frame 570).

According to the present aspect, the flexibility in arrangement of the coupler antennas can be increased.

<Fifth Aspect>

In the testing device 1 according to the present aspect, each of the coupler antennas 300 takes a horizontally polarized attitude for receiving horizontally polarized waves or a vertically polarized attitude for receiving vertically polarized waves, and the coupler antennas can be selectively attached in a horizontally polarized attitude and a vertically polarized attitude to the coupler support unit (the coupler attachment frame 570).

In the present aspect, the coupler antennas are means for transmitting and receiving linearly polarized waves in one direction. Since the coupler support unit can support the coupler antennas in a horizontally polarized attitude or a vertically polarized attitude, various characteristic tests using different polarized waves in certain directions can be performed according to the present aspect. Further, the present aspect can increase the flexibility in arrangement of the coupler antennas.

<Sixth Aspect>

In the testing device 1 according to the present aspect, the communication device support unit (the tray body 220) has a structure that enables the coupler antennas 300 to be arranged in the coupler antenna array (300A, 300B, or 300C) corresponding to a horizontal direction (a direction of the elevation angle of 0 degree) of the test target antenna (the communication antenna 250) of the supported communication device 240.

According to the present aspect, the flexibility in arrangement of the coupler antennas can be increased.

<Seventh Aspect>

In the testing device 1 according to the present aspect, each of the coupler antennas 300 is arranged at a location where radio waves emitted from the test target antenna (the communication antenna 250) toward one of the coupler antennas are sufficiently attenuated in adjacent other ones of the coupler antennas.

According to the present aspect, the reception levels of radio waves can be distinguishably observed on a characteristic graph.

<Eighth Aspect>

In the testing device 1 according to the present aspect, distances between the test target antenna (the communication antenna 250) and the coupler antennas 300 constituting each of the coupler antenna arrays (300A, 300B, and 300C) are equal (distances La, Lb, and Lc).

According to the present aspect, when antenna beams are emitted from the test target antenna to the coupler antennas, correction in consideration of the space loss to values of the reception levels of radio waves received by the coupler antennas can be performed with a fixed value and various characteristic values can be easily obtained.

<Ninth Aspect>

The present aspect is, the present aspect is a testing device 1 for a communication device, that performs characteristic tests in a near field on a test target antenna (a communication antenna 250) for a microwave band or a milliwave band included in a communication device 240, and includes an anechoic box (a housing 100, a panel portion 210 of a tray unit 200, and radio wave absorbers 131 and 211) that forms a test space S as an anechoic chamber, a communication device support unit (a tray body 220) that supports the communication device in the test space, and a coupler support unit (a coupler support member 820) that supports a plurality of coupler antennas 300 receiving radio waves emitted from the test target antenna or transmitting radio waves to the test target antenna.

The coupler support unit is configured to be capable of forming a first coupler antenna array (one of coupler antenna arrays 300D1 to 300D4) configured to include a plurality of coupler antennas arranged in a row on a first arc around the test target antenna, and a second coupler antenna array (another of the coupler antenna arrays 300D1 to 300D4) configured to include a plurality of coupler antennas arranged in a row on a second arc around the test target antenna.

According to the present aspect, the coupler antennas can be arranged on a spherical face around the test target antenna. Therefore, correction in consideration of the space loss to values of the reception levels of radio waves received by the coupler antennas when antenna beams are emitted from the test target antenna to the coupler antennas can be performed with a fixed value and various characteristic values can be easily obtained.

<Tenth Aspect>

The testing device according to the present aspect is characterized in including an XY stage 810 that horizontally moves the coupler support unit (the coupler support member 820) in the test space S.

According to the present aspect, the coupler antennas can be moved according to the location of a test target antenna mounted on a communication device.

<Eleventh Aspect>

The testing device 1 according to the present aspect is a device that performs characteristic tests in a near field on at least one test target antenna (a communication antenna 250) for a microwave band or a milliwave band included in a communication device 240.

The testing device includes an anechoic box (a housing 100, a panel portion 210 of a tray unit 200, and radio wave absorbers 131 and 211) that forms a test space S as an anechoic chamber, a communication device support unit (tray bodies 220 and 620) that supports the communication device in the test space, and a coupler support unit (a frame unit, a coupler support member, and a coupler unit) that detachably supports a plurality of coupler antennas 300 receiving radio waves emitted from the test target antenna or transmitting radio waves to the test target antenna. The coupler support unit supports the coupler antennas to cause antenna beams 310 of the coupler antennas to focus on the test target antenna being a test target of the coupler antennas.

According to the present aspect, characteristic tests on the test target antenna are performed in a near field range and therefore the testing device can be downsized. Various characteristic tests on a communication device compatible with 5G can be performed with the present testing device alone.

Since the coupler antennas can be arranged at locations where the antenna beams of the coupler antennas focus on the test target antenna, radio waves emitted from the test target antenna are enabled to reliably reach the coupler antennas and accurate measurement can be performed.

<Twelfth Aspect>

In the testing device 1 according to the present aspect, the coupler support unit (the frame unit, the coupler support member, and the coupler unit) is configured to be capable of forming a coupler antenna group (coupler antenna arrays 300A to 300D) configured to include at least three of the coupler antennas 300 facing the test target antennas (the communication antennas 250) with respect to each of the test target antennas.

In the present aspect, a coupler antenna group can be formed of a plurality of coupler antennas facing each of the test target antennas to associate the coupler antenna group with each of the test target antennas. With this configuration, radio waves emitted from each of the test target antennas are enabled to reliably reach the associated coupler antennas and accurate measurement can be performed.

<Thirteenth Aspect>

In the testing device 1 according to the present aspect, the coupler support unit (the frame unit, the coupler support member, and the coupler unit) enables the coupler antennas 300 constituting each of the coupler antenna groups to be arranged in a row on a spherical face or along an arc around the test target antenna (the communication antenna 250) corresponding to the associated coupler antenna group.

In the present aspect, the coupler antennas are arranged on a spherical face around the associated test target antenna or along an arc around the test target antenna. Therefore, the distances between the coupler antennas in one group and the associated test target antenna are equal. According to the present aspect, a more accurate test result can be obtained based on measurement values.

<Fourteenth Aspect>

In a testing device 1D according to the present aspect, the coupler support unit (a coupler unit 900) includes a guide unit (a guide rail 930 and a coupler slider 940) that moves back and forth each of the coupler antennas 300, 300, . . . constituting one of the coupler antenna groups along an arc (an inner-periphery coupler antenna array or a rear coupler antenna array).

According to the present aspect, arrangement of the coupler antenna 300 in the test space S can be flexibly changed. Since the coupler antennas are moved back and forth along an arc according to the present aspect, the coupler antenna can be freely moved while the distances between the test target antenna and the coupler antennas are maintained constant.

<Fifteenth Aspect>

In a testing device 1E according to the present aspect, the coupler support unit (a coupler unit 1000) includes a guide unit (a guide rail 1021 and a coupler slider 1030) that moves back and forth each of the coupler antennas 300, 300, . . . constituting one of the coupler antenna groups along a direction intersecting with the arc (a side coupler antenna array or a rear coupler antenna array).

According to the present aspect, arrangement of the coupler antennas 300 in the test space S can be flexibly changed. Since the coupler antennas are moved back and forth along the direction intersecting with the arc according to the present aspect, the configuration of the guide unit can be simplified and the testing device can be downsized.

<Sixteenth Aspect>

In the testing device 1 according to the present aspect, the coupler antennas 300 are units that transmit and receive linearly polarized waves in one direction, and the coupler support unit (the frame unit, the coupler support member, and the coupler unit) supports the coupler antennas in either a horizontally polarized attitude for transmitting and receiving horizontally polarized waves or a vertically polarized attitude for transmitting and receiving vertically polarized waves.

Even when the coupler antennas handle linearly polarized waves in one direction, the coupler antennas can be attached to the coupler support unit while the attitudes are switched between that enabling transmission and reception of horizontally polarized waves and that enabling transmission and reception of vertically polarized waves. Therefore, various characteristic tests using different polarized waves in certain directions can be performed.

<Seventeenth Aspect>

In the testing device 1 according to the present aspect, the coupler antennas 300 are units that transmit and receive linearly polarized waves in one direction, and each of the coupler antennas is supported by a coupler rotating mechanism 950 that displaces each coupler antenna to a horizontally polarized attitude for transmitting and receiving horizontally polarized waves or a vertically polarized attitude for transmitting and receiving vertically polarized waves.

Even when the coupler antennas handle linearly polarized waves in one direction, the coupler antennas can be switched by the associated coupler rotating mechanism to an attitude where horizontally polarized waves can be transmitted or received or an attitude where vertically polarized waves can be transmitted and received. Therefore, various characteristic tests using different polarized waves in certain directions can be performed.

REFERENCE SIGNS LIST

1 testing device 1, 1D 1E, 100 housing, 101 housing body, 103 upper cover, 107 clasp, 109 hinge portion, 111 tray opening, 113 front panel, 115 flange portion, 117 grip, 121, 122, 123 coaxial connector, 125 USB connector, 131 radio wave absorber, 141 cable guide, 150 guide rail, 151 outer guide rail, 153 inner guide rail, 200 tray unit (communication device support unit), 210 panel portion, 211 radio wave absorber, 213 tray handle, 215 USB connector, 220 tray body, 230 slider, 231 outer slider, 233 inner slider, 240 communication device, 241 display, 243*a* one end edge, 243*b* the other end edge, 243*c* upper end edge, 243*d* lower end edge, 250 communication antenna (test target antenna), 250*a*1 to 250*d* communication antenna, 300 coupler antenna, 300A1 to 300D3 coupler antenna array, 300E, V, H coupler antenna, 301 case, 301*a* front cover, 301*b* rear cover, 303 attachment base, 307 transmitting/receiving face, 310 antenna beam, 311 beam spot, 320 antenna body, 400 NFC antenna unit, 410 housing attachment piece, 410*a* one portion, 410*b* attachment face, 450 camera unit, 500 frame unit, 510 bottom frame, 511 bottom base, 513 bottom side frame, 515 second antenna housing space, 520 coupler support frame (coupler support unit), 521 front frame, 523 rear frame, 530 lower frame, 531 lower base, 531*a* opening, 533 lower front frame, 535 lower rear frame, 550 upper frame, 551 upper base, 553 upper front frame, 555 upper rear frame, 570 coupler attachment frame, 571 screw hole, 571*a*, 571*b* screw hole, 600 tray unit (communication device support unit), 620 tray body, 621 arm portion, 621*a* front end portion, 621*b* rear end portion, 623 mount portion, 625 positioning member, 700 frame unit, 710 intermediate frame, 711 intermediate front frame, 713 intermediate rear frame, 800 coupler unit (coupler support unit), 801 X-direction rail, 802 stage base, 803 Y-direction rail, 804 X stage, 805 Y stage, 810 XY stage, 820 coupler support member, 821 fixed base, 823, 825 support arm, 900 coupler unit (coupler support unit), 910 front unit, 911 front slide frame, 913 housing attachment piece, 915 cable guide, 920 rear unit, 921 rear slide frame, 925 cable guide, 930 guide rail (guide unit), 931 curved portion, 932 connecting portion, 933 guide groove, 940 coupler slider (guide unit), 941 slider base, 943 guide roller pair, 943*a*, 943*b* guide roller, 950 coupler rotating mechanism (first coupler rotating mechanism), 951 rotation base, 953 elongate hole, 955 screw, 1000 coupler unit (coupler support unit), 1011 right side unit, 1012 left side unit, 1013 rear unit, 1020 subunit, 1021 guide rail (guide unit), 1023 guide groove, 1030 coupler slider (guide unit), 1031 click, 1033 fixing screw, 1035 pivotally support portion, 1040 housing attachment piece, 1040*a* one portion, 1040*b* fitting face, 1050 coupler rotating mechanism (second coupler rotating mechanism), 1051 rotation base.

The invention claimed is:

1. A testing device for a communication device, that performs characteristic tests in a near field on at least one test target antenna fora microwave band or a milliwave band included in the communication device, the testing device comprising:

- a housing that forms a test space as an anechoic chamber in a hollow portion;
- a communication device support unit that supports the communication device in the test space; and
- a coupler support unit that detachably supports a plurality of coupler antennas receiving radio waves emitted from the test target antenna or transmitting radio waves to the test target antenna, wherein
- the coupler support unit includes
  - a plurality of guide rails that linearly extend along one face of the test space and that support the coupler antennas to be movable back and forth along a longitudinal direction of the extending, and
  - a plurality of housing attachment pieces where each has one portion fixed to the housing and where each includes an attachment face supporting an associated one of the guide rails at a predetermined elevation angle on another portion,
- a length from each of the one portions to a corresponding one of the attachment faces, and an inclination angle of each of the attachment faces are set to cause an antenna beam of a corresponding one of the coupler antennas supported by an associated one of the guide rails to be emitted to the communication device at a predetermined elevation angle, and
- a plurality of the coupler antennas supported by each of the guide rails respectively set to different elevation angles by each of associated housing attachment pieces form one coupler antenna group, and the antenna beams from the coupler antennas forming the one coupler antenna group are caused to focus on the test target antenna that is handled by the one coupler antenna group as a test target.

2. The testing device according to claim 1, wherein the coupler antennas constituting the one coupler antenna group are arranged on an arc around the test target antenna.

3. The testing device according to claim 1, wherein the guide rails that support the coupler antennas forming the one coupler antenna group extend in parallel, and the coupler antennas that form the one coupler antenna group are arranged at locations in the longitudinal direction facing the test target antenna.

4. The testing device according to claim 1, wherein each of the guide rails supports an arbitrary number of the coupler antennas to be independently movable back and forth, and a plurality of the coupler antennas arranged on one of the guide rails form a different one of the coupler antenna groups.

5. The testing device according to claim 1, wherein a plurality of units each including a plurality of the guide rails that enable the supported coupler antennas to form at least one of the coupler antenna groups are included around the communication device.

6. The testing device according to claim 1, wherein the coupler antennas are units that transmit and receive linearly polarized waves in one direction, the coupler support unit includes coupler sliders where each can move back and forth on an associated one of the guide rails in a state supporting an associated one of the coupler antennas and where each can fix the coupler antenna at a certain location in the longitudinal direction of the associated guide rail, and each of the coupler sliders includes a first coupler rotating mechanism that displaces the associated coupler antenna to a horizontally polarized attitude for transmitting and receiving horizontally polarized waves or a vertically polarized attitude for transmitting and receiving vertically polarized waves.

7. The testing device according to claim 6, wherein the first coupler rotating mechanism is configured to include a rotation base that supports the associated coupler antenna and that has an arc-like elongate hole around the antenna beam as a rotation center formed thereon, and a screw that rotates the rotation base along the elongate hole in a forward direction or a reverse direction by being screwed to the coupler slider through the elongate hole.

8. The testing device according to claim 6, wherein the coupler slider includes a second coupler rotating mechanism that adjusts an elevation angle of the antenna beam of the associated coupler antenna, and/or a third coupler rotating mechanism that adjusts an azimuth of the antenna beam of the coupler antenna.

9. The testing device according to claim 1, wherein the communication device includes a second test target antenna corresponding to a different frequency band from that of the test target antenna, the housing includes an upper cover that freely opens and closes an upper surface opening of a housing body, and the upper cover is configured to enable a testing antenna that transmits and receives radio waves to/from the second test target antenna and that performs a test on the second test target antenna to be attached thereto.

* * * * *